United States Patent
Tsai et al.

(10) Patent No.: US 11,776,998 B2
(45) Date of Patent: *Oct. 3, 2023

(54) GATE-ALL-AROUND DEVICE

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Chung-En Tsai, Hsinchu County (TW); Chia-Che Chung, Hsinchu (TW); Chee-Wee Liu, Taipei (TW); Fang-Liang Lu, New Taipei (TW); Yu-Shiang Huang, New Taipei (TW); Hung-Yu Yeh, Taichung (TW); Chien-Te Tu, Taipei (TW); Yi-Chun Liu, Taichung (TW)

(73) Assignees: TAIWAN SEMICONDUCTOR MANUFACTURING CO., LTD., Hsinchu (TW); NATIONAL TAIWAN UNIVERSITY, Taipei (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/582,731

(22) Filed: Jan. 24, 2022

(65) Prior Publication Data
US 2022/0149172 A1 May 12, 2022

Related U.S. Application Data

(63) Continuation of application No. 16/850,974, filed on Apr. 16, 2020, now Pat. No. 11,233,120.

(51) Int. Cl.
*H01L 29/06* (2006.01)
*H01L 21/02* (2006.01)
(Continued)

(52) U.S. Cl.
CPC ...... *H01L 29/0673* (2013.01); *H01L 21/0262* (2013.01); *H01L 21/02433* (2013.01);
(Continued)

(58) Field of Classification Search
CPC ............ H01L 29/0653; H01L 29/0673; H01L 21/02532; H01L 29/42392; H01L 29/7848;
(Continued)

(56) References Cited

U.S. PATENT DOCUMENTS 11,233,120 B2\* 1/2022 Tsai ................ H01L 29/42392
2019/0131394 A1 5/2019 Reznicek
(Continued)

OTHER PUBLICATIONS

S. Barraud et al., "Tunability of Parasitic Channel in Gate-All-Around Stacked Nanosheets," 2018 IEEE International Electron Devices Meeting (IEDM), 2018.
(Continued)

*Primary Examiner* — Changhyun Yi
(74) *Attorney, Agent, or Firm* — Maschoff Brennan

(57) ABSTRACT

A device comprises a plurality of nanosheets, source/drain stressors, and a gate structure wrapping around the nanosheets. The nanosheets extend in a first direction above a semiconductor substrate and are arranged in a second direction substantially perpendicular to the first direction. The source/drain stressors are on either side of the nanosheets. Each of the source/drain stressors comprises a first epitaxial layer and a second epitaxial layer over the first epitaxial layer. The first and second epitaxial layers are made of a Group IV element and a Group V element. An atomic ratio of the Group V element to the Group IV element in the second epitaxial layer is greater than an atomic ratio of the Group V element to the Group IV element in the first epitaxial layer.

20 Claims, 37 Drawing Sheets

(51) Int. Cl.
H01L 21/306 (2006.01)
H01L 29/08 (2006.01)
H01L 29/10 (2006.01)
H01L 29/423 (2006.01)
H01L 29/66 (2006.01)
H01L 29/78 (2006.01)
H01L 29/786 (2006.01)

(52) U.S. Cl.
CPC .. H01L 21/02532 (2013.01); H01L 21/02535 (2013.01); H01L 21/02609 (2013.01); H01L 21/30604 (2013.01); H01L 29/0665 (2013.01); H01L 29/0847 (2013.01); H01L 29/1037 (2013.01); H01L 29/42392 (2013.01); H01L 29/66545 (2013.01); H01L 29/66795 (2013.01); H01L 29/785 (2013.01); H01L 29/7848 (2013.01); H01L 29/78618 (2013.01); H01L 29/78696 (2013.01)

(58) Field of Classification Search
CPC ......... H01L 29/66545; H01L 29/66795; H01L 21/02535; H01L 21/02433; H01L 21/02609; H01L 21/0262
See application file for complete search history.

(56) References Cited

U.S. PATENT DOCUMENTS

2019/0131395 A1    5/2019   Lee
2019/0393091 A1*  12/2019   Cheng ............. H01L 21/823814
2021/0119031 A1    4/2021   Song

OTHER PUBLICATIONS

A. Khakifirooz et al., "Strain engineered extremely thin SOI (ETSOI) for high-performance CMOS," 2012 Symposium on VLSI Technology (VLSIT), p. 117-p. 118, 2012.

R. Xie et al., "A 7nm FinFET technology featuring EUV patterning and dual strained high mobility channels," 2016 IEEE International Electron Devices Meeting (IEDM), San Francisco, CA, 2016, pp. 2.7.1-2.7.4.

N. Loubet et al., "Stacked nanosheet gate-all-around transistor to enable scaling beyond FinFET," 2017 Symposium on VLSI Technology, Kyoto, 2017, pp. T230-T231.

R. Ritzenthaler et al., "Vertically Stacked Gate-All-Around Si Nanowire CMOS Transistors with Reduced Vertical Nanowires Separation, New Work Function Metal Gate Solutions, and DC/AC Performance Optimization," 2018 IEEE International Electron Devices Meeting (IEDM), San Francisco, CA, 2018, pp. 21.5.1-21.5.4.

H. Arimura et al., "Advantage of NW structure in preservation of SRB-induced strain and investigation of off-state leakage in strained stacked Ge NW pFET," 2018 IEEE International Electron Devices Meeting (IEDM), San Francisco, CA, 2018, pp. 21.2.1-21.2.4.

Dong-Il Bae et al., "A novel tensile Si (n) and compressive SiGe (p) dual-channel CMOS FinFET co-integration scheme for 5nm logic applications and beyond," 2016 IEEE International Electron Devices Meeting (IEDM), 2016.

A. Khakifirooz et al., "Aggressively scaled strained silicon directly on insulator (SSDOI) FinFETs," 2013 IEEE SOI-3D-Subthreshold Microelectronics Technology Unified Conference (S3S), Monterey, CA, 2013, pp. 1-2.

H. Mertens et al., "Vertically stacked gate-all-around Si nanowire transistors: Key Process Optimizations and Ring Oscillator Demonstration," 2017 IEEE International Electron Devices Meeting (IEDM), San Francisco, CA, 2017, pp. 37.4.1-37.4.4.

* cited by examiner

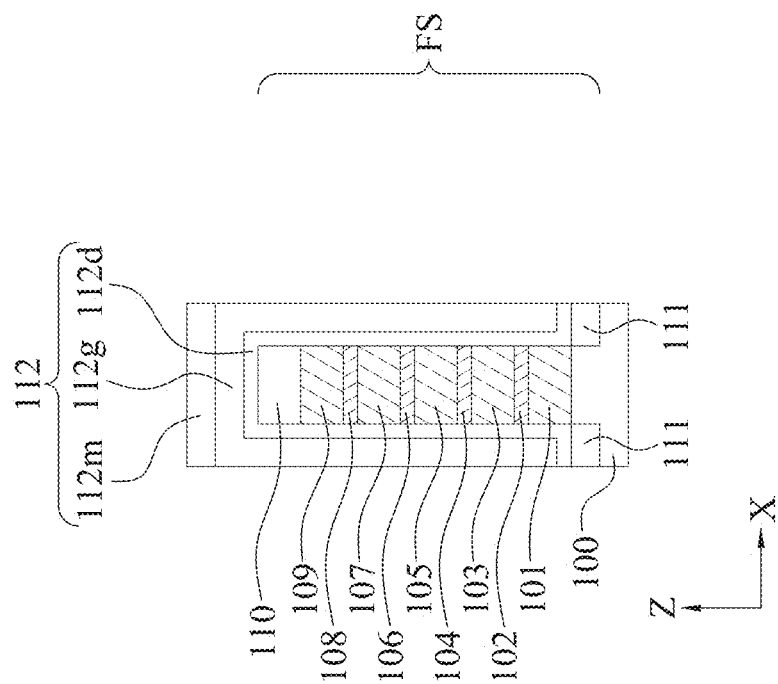
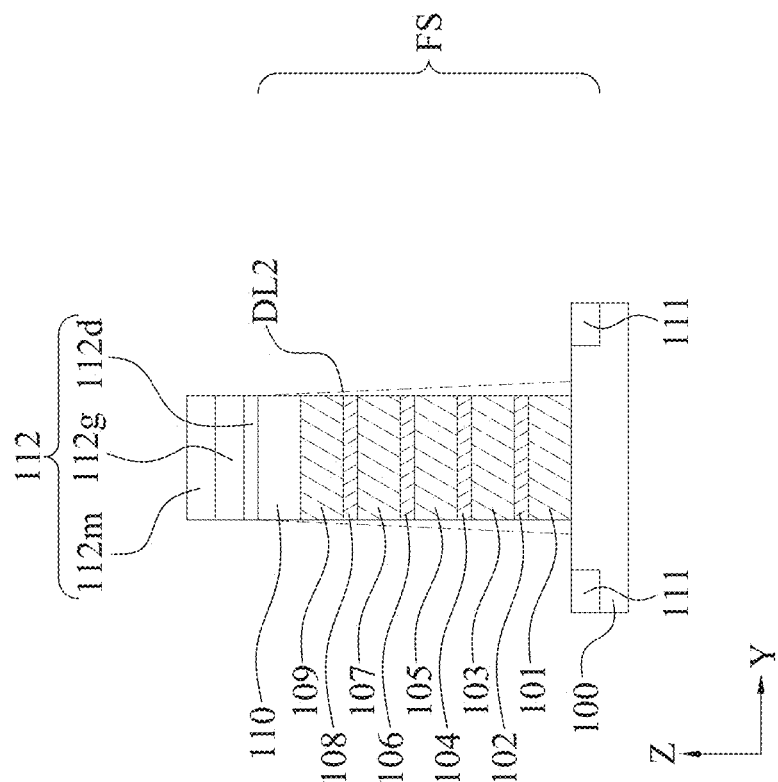

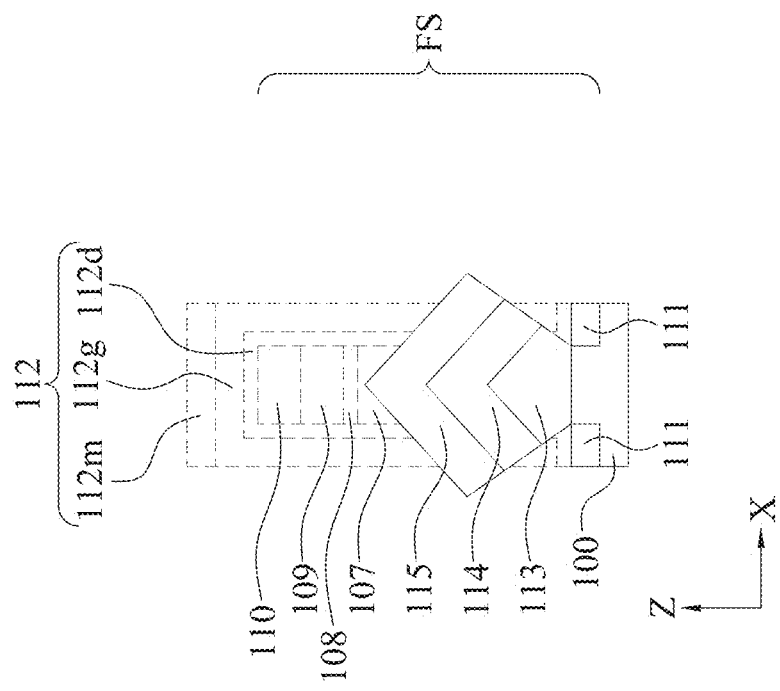
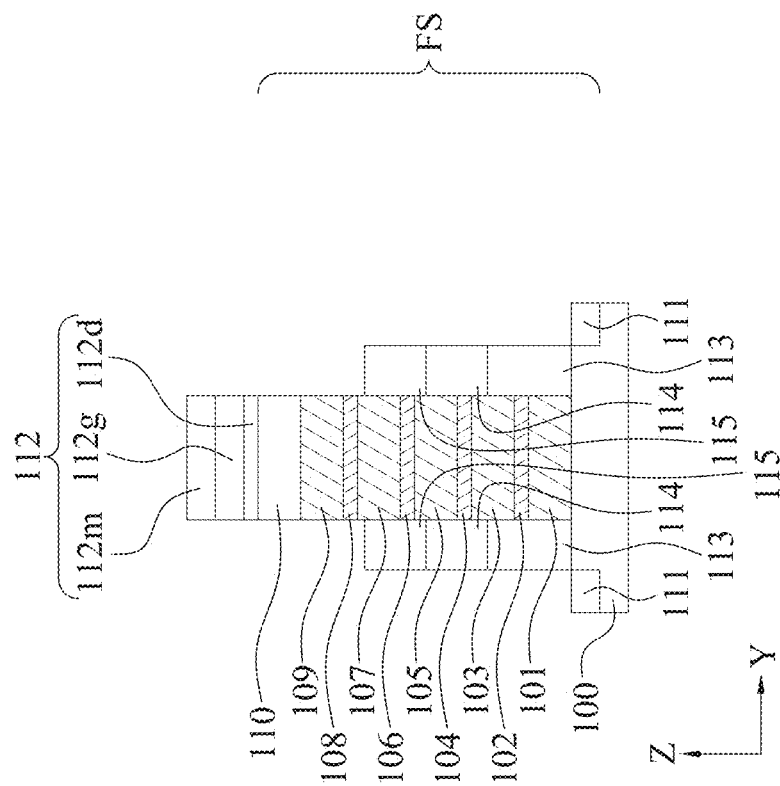
Fig. 9B
Fig. 9A

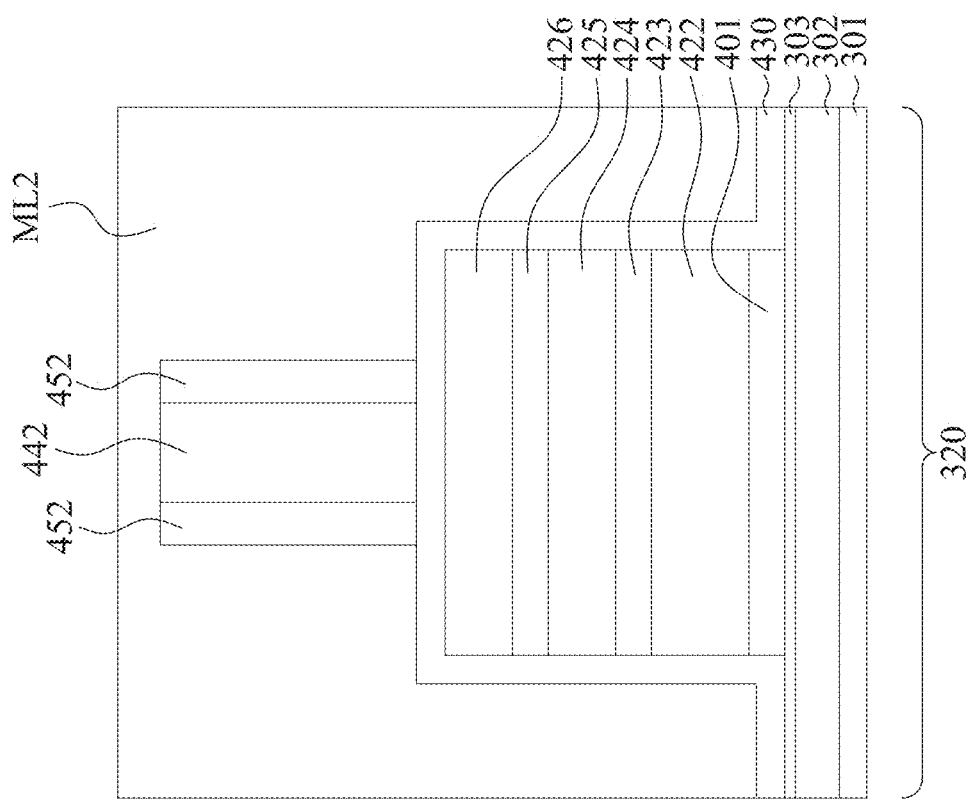
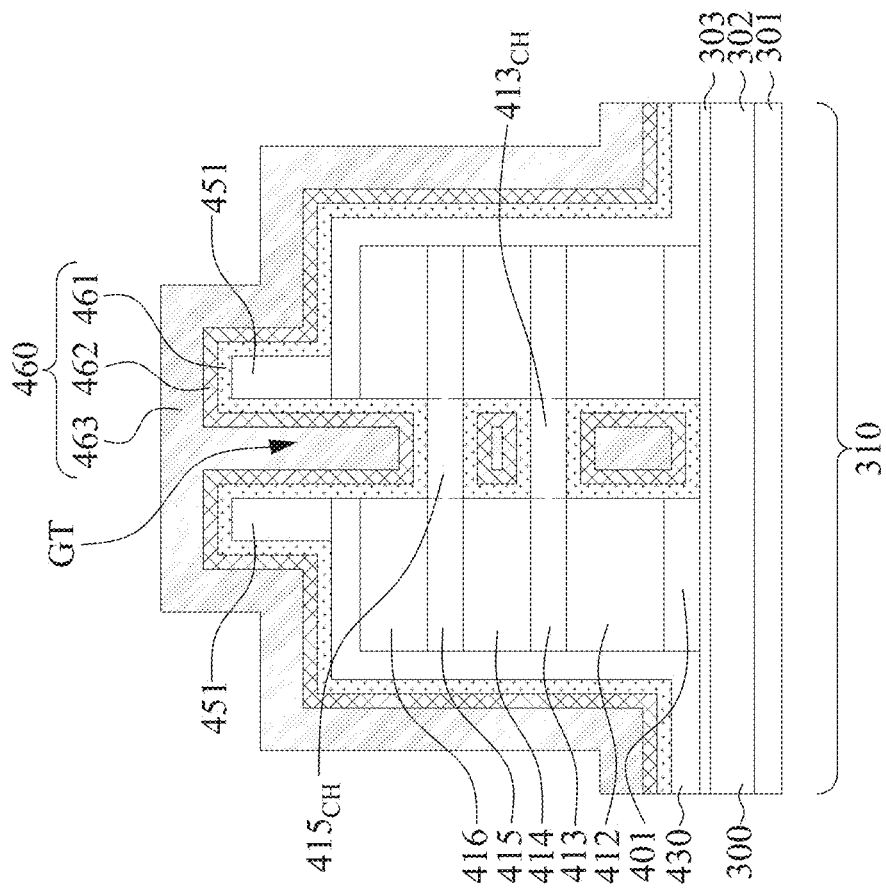
Fig. 25

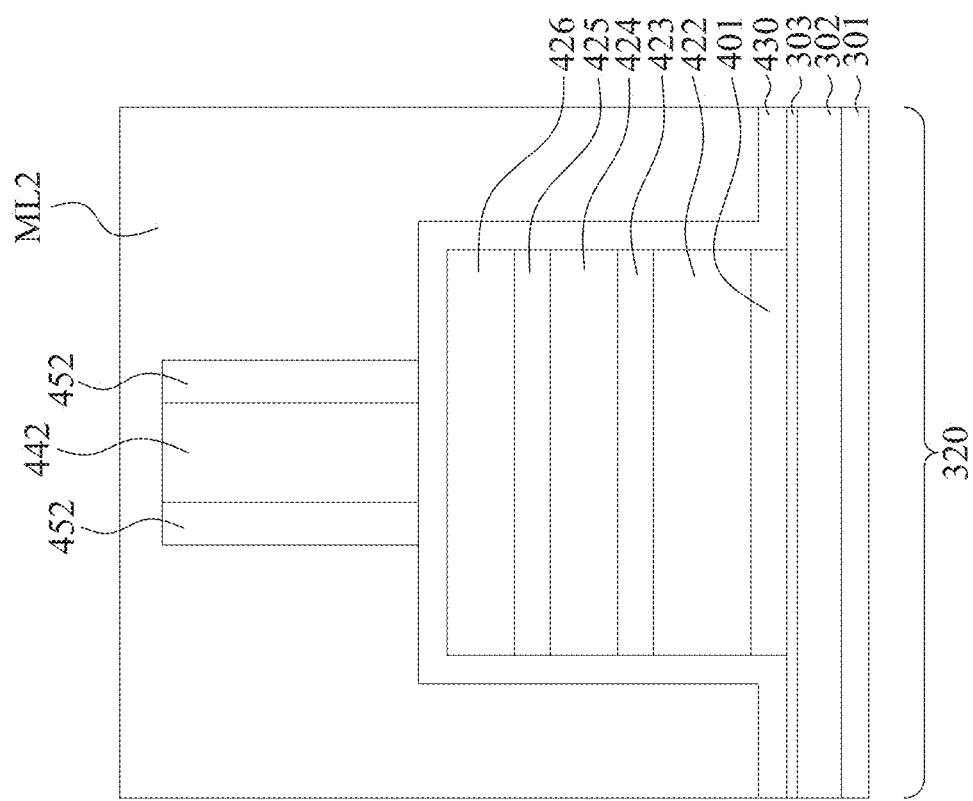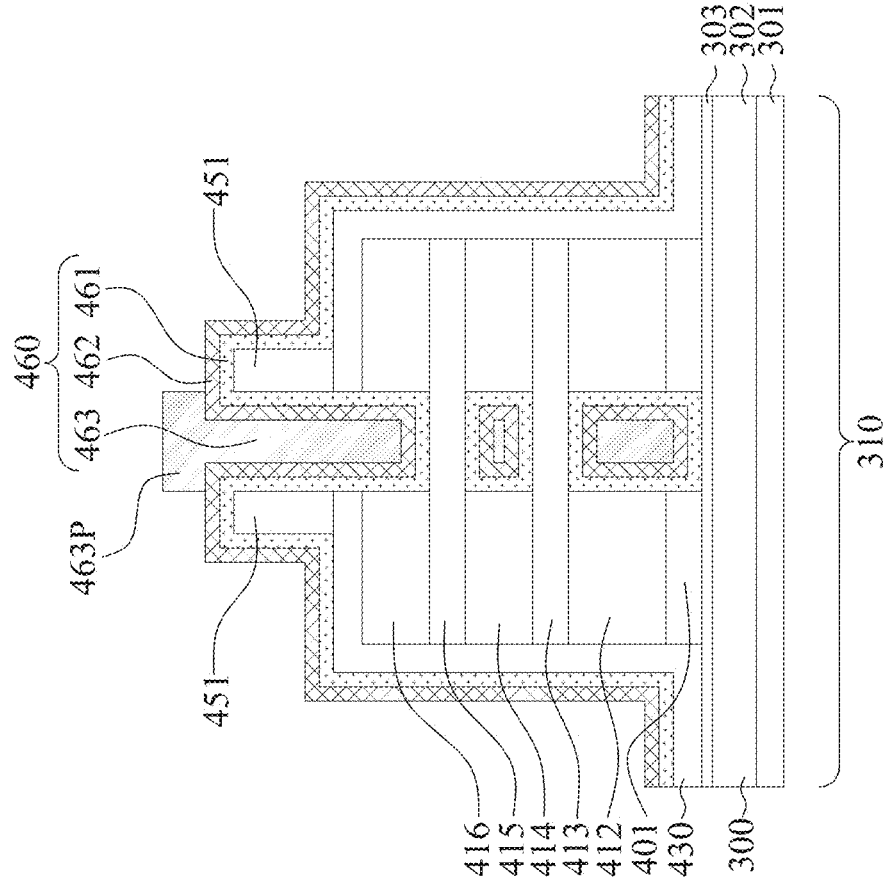
Fig. 26

US 11,776,998 B2

GATE-ALL-AROUND DEVICE

RELATED APPLICATIONS

This present application is a continuation of U.S. patent application Ser. No. 16/850,974, filed Apr. 16, 2020, now U.S. Pat. No. 11,233,120, issued on Jan. 25, 2022, which is herein incorporated by reference in its entirety.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-13B show exemplary sequential processes for manufacturing a GAA FET according to some embodiments of the present disclosure.

FIGS. 17-30 show exemplary sequential processes for manufacturing a GAA FET according to some embodiments of the present disclosure.

DETAILED DESCRIPTION

Figure 1:
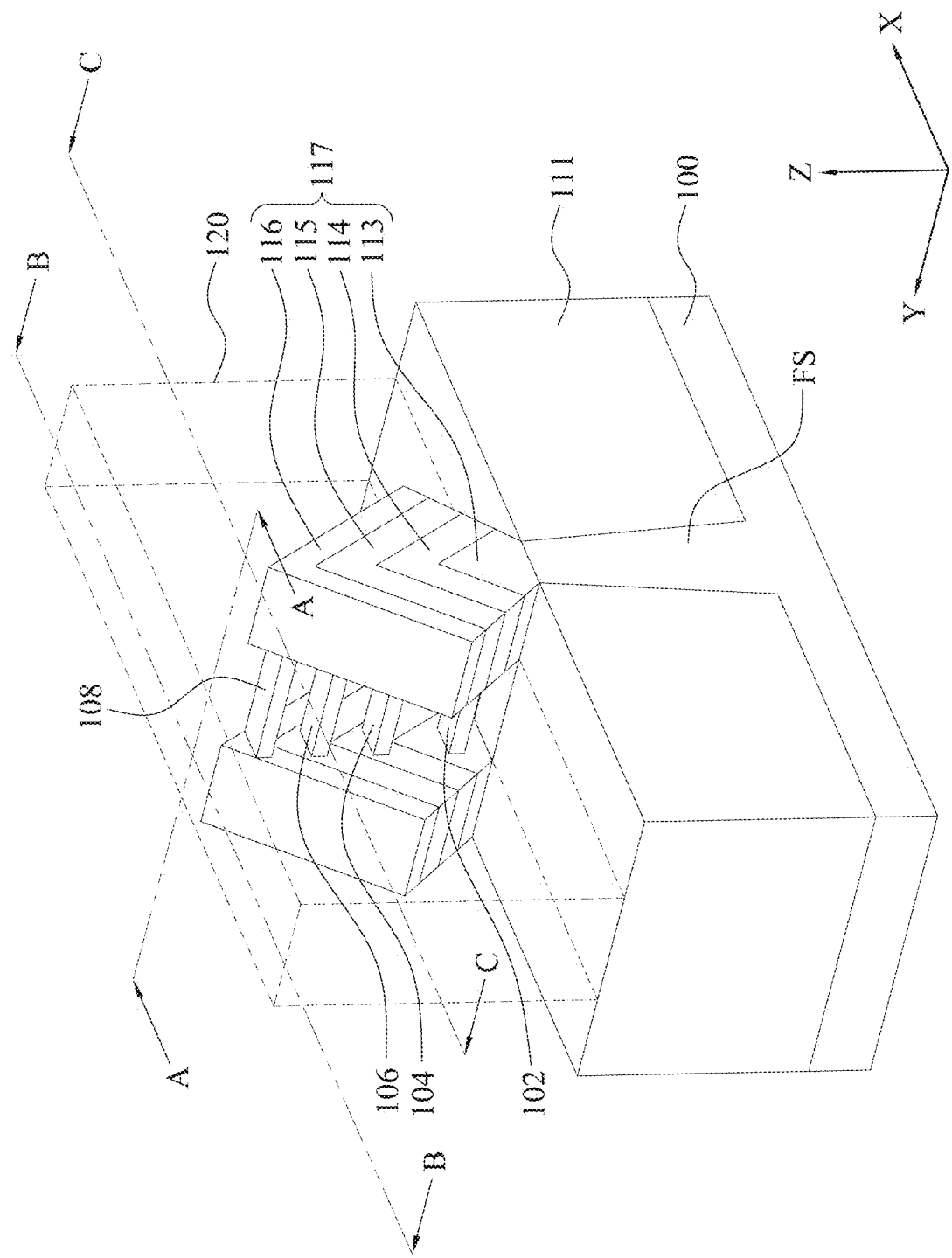
FIG. 1 shows a perspective view of a GAA FET semiconductor device showing one of the stages of a manufacturing process according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a perspective view of a GAA FET semiconductor device showing one of the stages of a manufacturing process according to an embodiment of the present disclosure. One or more gate structures 120 extending in the X-direction are disposed over one or more fin structures FS extending in the Y-direction. The X-direction is substantially perpendicular to the Y-direction. The fin structures FS are formed over a semiconductor substrate 100. A lower portion of the fin structure FS is embedded in an isolation insulating layer 111, and the gate structure 120 wraps around semiconductor nanosheets 102, 104, 106 and 108 that are vertically arranged above the fin structure FS. Source/drain stressors 117 are formed on opposite sides of the gate structure 120. Each of the source/drain stressors 117 includes two or more regrown source/drain layers (e.g., layers 113, 114, 115 and 116 as illustrated in FIG. 1). The regrown source/drain layers each have a first chemical element (e.g., silicon) and a second chemical element (e.g., germanium), but have different atomic ratios of the second chemical element to the first chemical element. In this way, the atomic ratio (e.g., germanium-to-silicon atomic ratio) difference among the regrown source/drain layers can be tuned to reduce the strain mismatch among the semiconductor nanosheets 102, 104, 106 and 108, which will be explained in greater detail below.

Figure 10B:
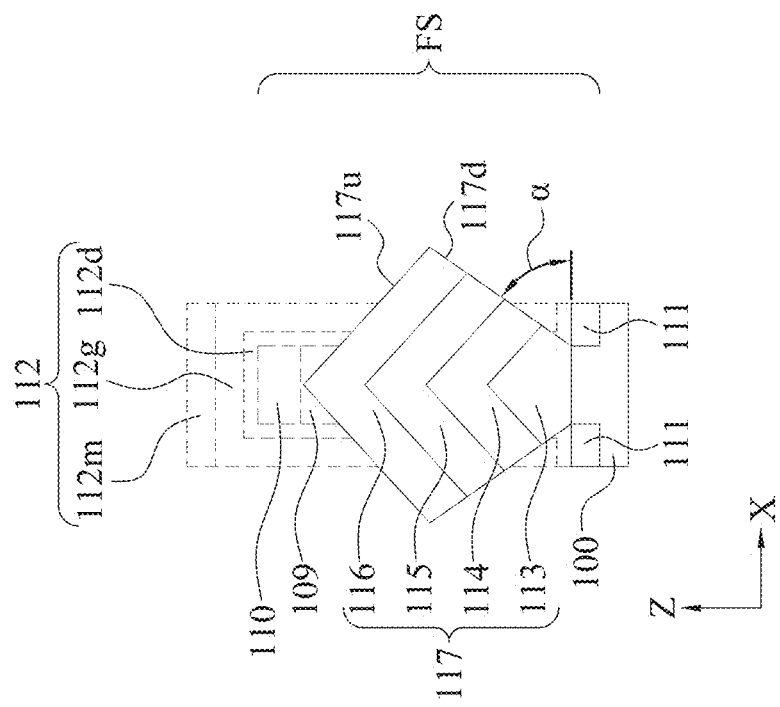
Figure 10A:
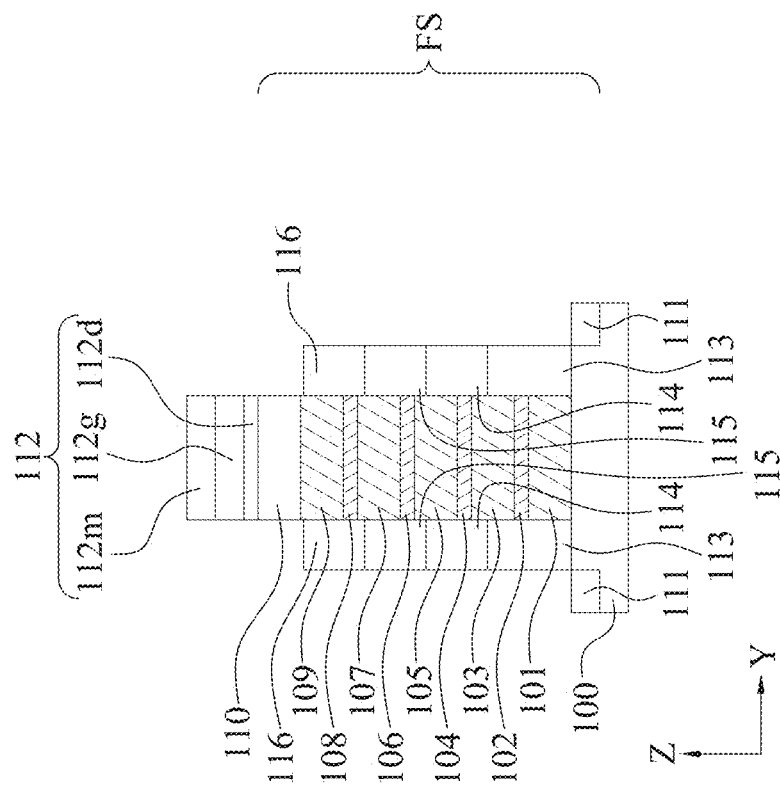
Figure 11B:
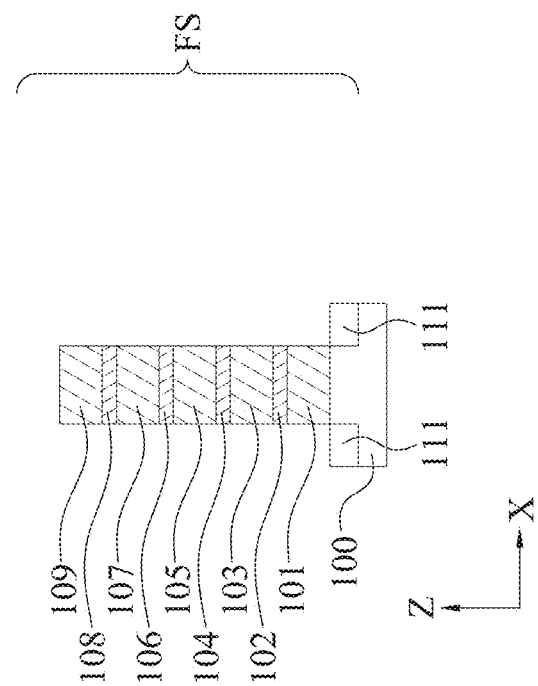
Figure 11A:
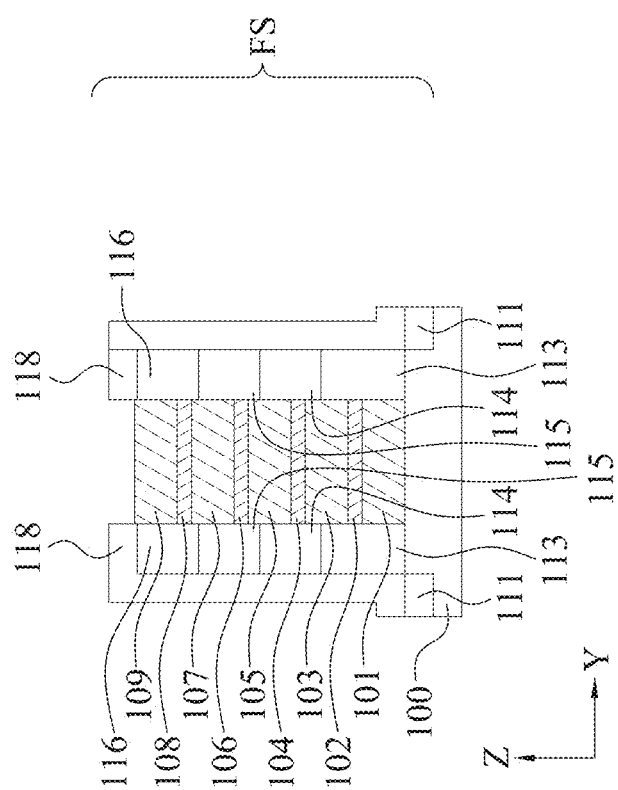
Figure 12A:
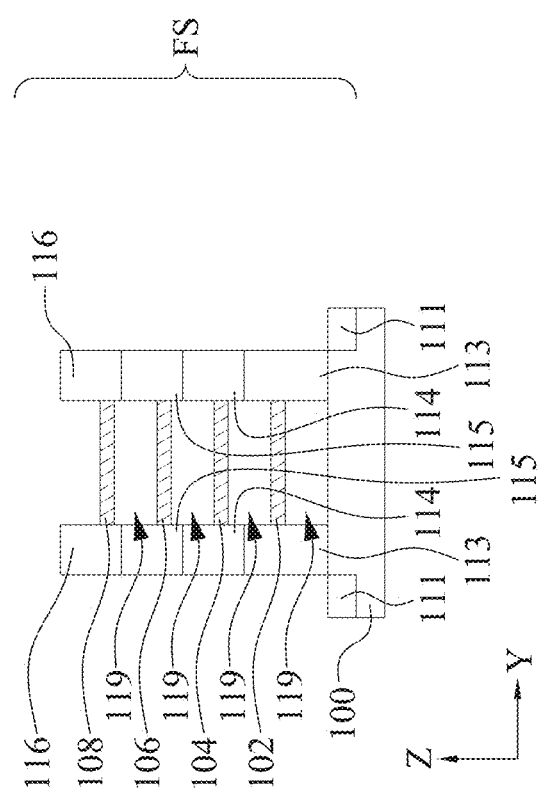
Figure 12B:
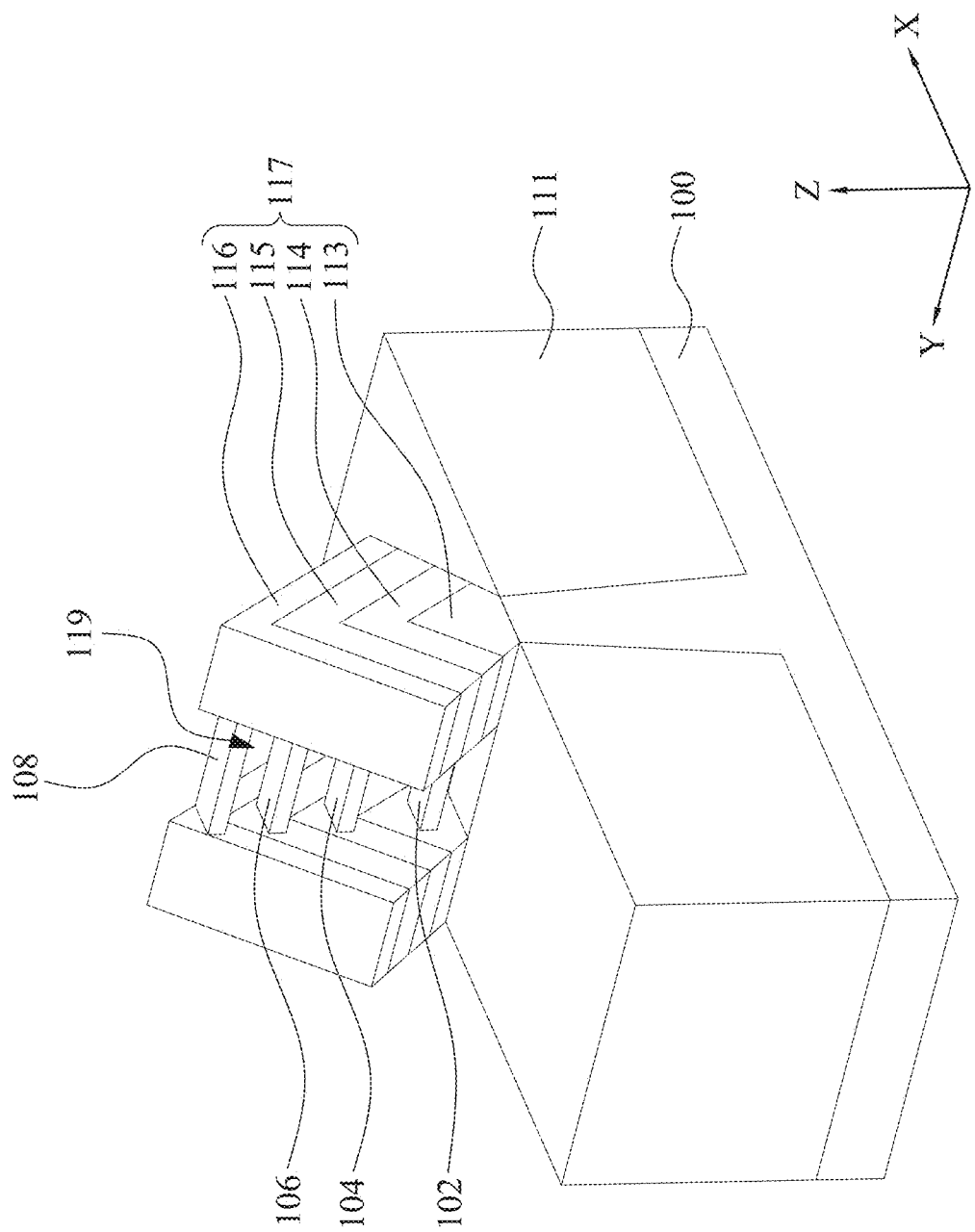

FIGS. 2A-13B show exemplary sequential processes for manufacturing a GAA FET according to some embodiments of the present disclosure. It is understood that additional operations can be provided before, during, and after processes shown by FIGS. 2A-13B, and some of the operations described below can be replaced or eliminated, for additional embodiments of the method. The order of the operations/processes may be interchangeable. In FIGS. 2A-11B, 12A, 13A and 13B, the "A" figures (e.g., FIG. 2A) illustrate a cross-sectional view along Y-direction corresponding to the line A-A illustrated in FIG. 1, FIGS. 2B, 3B, 4B, 5B, 6B, 11B and 13B illustrate a cross-sectional view along the X-direction corresponding to the line B-B illustrated in FIG. 1, FIGS. 7B, 8B, 9B, and 10B illustrate a cross-sectional view along the X-direction corresponding to the line C-C illustrated in FIG. 1. FIG. 12B illustrates a perspective view at the intermediate stage corresponding to the cross-sectional view of FIG. 12A.

Figure 2B:
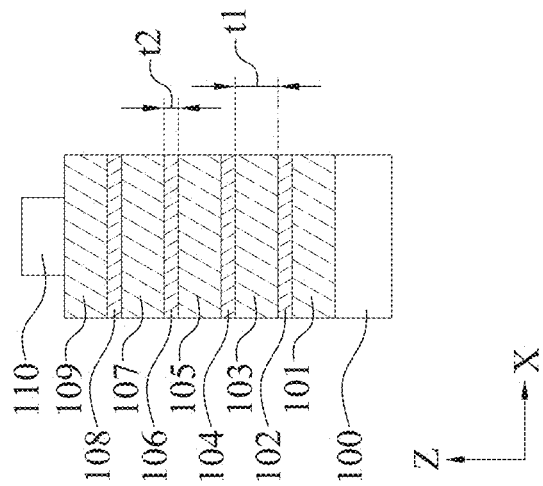
Figure 2A:
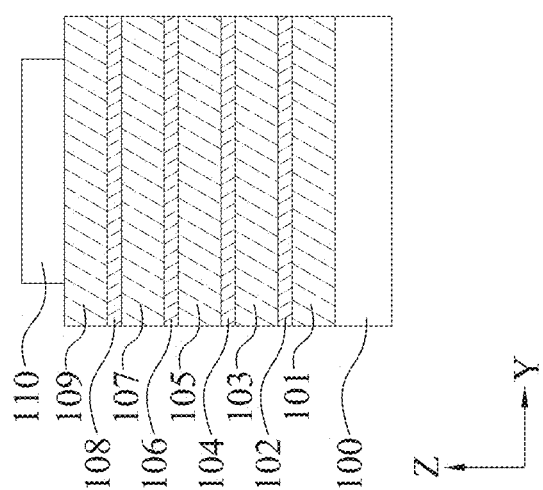

As shown in FIGS. 2A and 2B, a semiconductor substrate 100 is provided. In some embodiments, the substrate 100 may be a semiconductor substrate, such as a bulk semiconductor substrate, a semiconductor-on-insulator (SOI) substrate, a multi-layered or gradient substrate, or the like. The substrate 100 may include a semiconductor material, such as an elemental semiconductor including Si and Ge; a compound or alloy semiconductor including SiC, SiGe, GeSn, GaAs, GaP, GaAsP, AlInAs, AlGaAs, GaInAs, InAs, GaInP, InP, InSb, GaInAsP; a combination thereof, or the like. The substrate 100 may be doped or substantially un-doped. In a specific example, the substrate 100 is a bulk silicon substrate, which may be a wafer.

The substrate 100 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP.

Impurity ions (interchangeably referred to as dopants) are implanted into the silicon substrate 100 to form a well region (not shown). The ion implantation is performed to prevent a punch-through effect. The substrate 100 may include various regions that have been suitably doped with impurities (e.g., p-type or n-type conductivity). The dopants are, for example, boron ($BF_2$) for an n-type GAA FET and phosphorus for a p-type GAA FET.

In some embodiments of the present disclosure a layer stack is prepared, as shown in FIGS. 2A and 2B. A first semiconductor layer (first buffer layer) 101 is formed over the substrate 100. A second semiconductor layer (first channel layer) 102 is formed over the first semiconductor layer 101. Another first semiconductor layer (second buffer layer) 103 is formed over the second semiconductor layer 102. Another second semiconductor layer (second channel layer) 104 is formed over the another first semiconductor layer 103. Another first semiconductor layer (third buffer layer) 105 is formed over the second semiconductor layer 104. Another second semiconductor layer (third channel layer) 106 is formed over the first semiconductor layer 105. Another first semiconductor layer (fourth buffer layer) 107 is formed over the second semiconductor layer 106. Another second semiconductor layer (fourth channel layer) 108 is formed over the first semiconductor layer 107. Another first semiconductor layer (fifth buffer layer) 109 is formed over the second semiconductor layer 108.

In some embodiments, the first and second semiconductor layers are alternately stacked such that there are more than two layers each of the first and second semiconductor layers. In some embodiments, each of the second semiconductor layers, which become the nanosheets or channel layers, can be formed of different materials. The nanosheets can be interchangeably referred to as nanowires, nanoslabs and nanorings, depending on their geometry. In some embodiments, the lattice constant of the second semiconductor layers is greater than the lattice constant of the first semiconductor layers. In other embodiments, the lattice constant of the second semiconductor layers is smaller than the lattice constant of the first semiconductor layers.

In some embodiments, the first and second semiconductor layers are made of different materials selected from the group consisting of Si, Ge, SiGe, GeSn, Si/SiGe/Ge/GeSn, SiGeSn, and combinations thereof. In some embodiments, the first and second semiconductor layers are formed by epitaxy. In some embodiments, the SiGe is $Si_{1-x}Ge_x$, where $0.1 \le x \le 0.9$.

In some embodiments, the first semiconductor layers 101, 103, 105, 107 and 109 are formed of a first semiconductor material. In some embodiments, the first semiconductor material includes a first Group IV element and a second Group IV element. The Group IV elements are selected from the group consisting of C, Si, Ge, Sn, and Pb. In some embodiments, the first Group IV element is Si and the second Group IV element is Ge. In certain embodiments, the first semiconductor material is $Si_{1-x}Ge_x$, wherein $0.2 \le x \le 0.9$. For example, the first semiconductor material is $Si_{0.8}Ge_{0.2}$. In some embodiments, the first semiconductor layers 101, 103, 105, 107 and 109 have substantially the same atomic ratio of silicon to germanium (e.g., $Si_{0.8}Ge_{0.2}$).

In some embodiments, the second semiconductor layers 102, 104, 106 and 108 are formed of a second semiconductor material. In some embodiments, the second semiconductor material includes a first Group IV element and a second Group IV element. In some embodiments, the first Group IV element is Si and the second Group IV element is Ge. In some embodiments, the amounts of the first Group IV element and second Group IV element are different in the second semiconductor material than in the first semiconductor material. In some embodiments, the amount of Ge in the first semiconductor material is greater than the amount of Ge in the second semiconductor material. For example, the second semiconductor material is $Si_{1-y}Ge_y$, wherein $0.1 \le y \le 0.8$, and $x > y$. In some embodiments, the second semiconductor material includes a Group III element and a Group V element. In certain embodiments, the second semiconductor material is silicon. Stated another way, the second semiconductor material is substantially free of germanium.

The first semiconductor layers 101, 103, 105, 107, 109 and second semiconductor layers 102, 104, 106 and 108 may be formed by one or more epitaxy or epitaxial (epi) processes. The epitaxy processes include CVD deposition techniques (e.g., vapor-phase epitaxy (VPE) and/or ultra-high vacuum CVD (UHV-CVD)), molecular beam epitaxy (MBE), and/or other suitable processes.

In some embodiments, the thickness t2 of the second semiconductor layers (e.g., channel layers) 102, 104, 106 and 108 measured in the Z-direction is a range from about 5 nm to about 10 nm. The first semiconductor layers 101, 103, 105, 107 and 109 are not thinner than the second semiconductor layers 102, 104, 106 and 108. For example, the thickness t1 of the first semiconductor layers and the thickness t2 of the second semiconductor layers are related as $t1/t2=1$ to 8. In some embodiments, the thickness t1 of the first semiconductor layers measured in the Z-direction is in a range from about 10 nm to about 40 nm.

After the epitaxial growth process of the layer stack is complete, a patterned mask 110 is formed over the topmost first semiconductor layer 109. The patterned mask 110 may be formed using depositing a mask layer over the topmost first semiconductor layer 109, followed by patterning the mask layer into the patterned mask 110 using suitable photolithography and etching techniques. The patterned mask 110 includes silicon nitride ($Si_3N_4$), silicon oxide, the like, or combinations thereof.

Figure 3B:
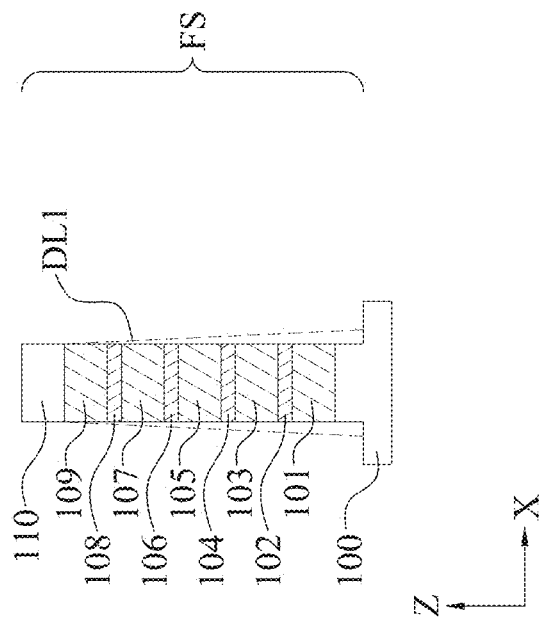
Figure 3A:
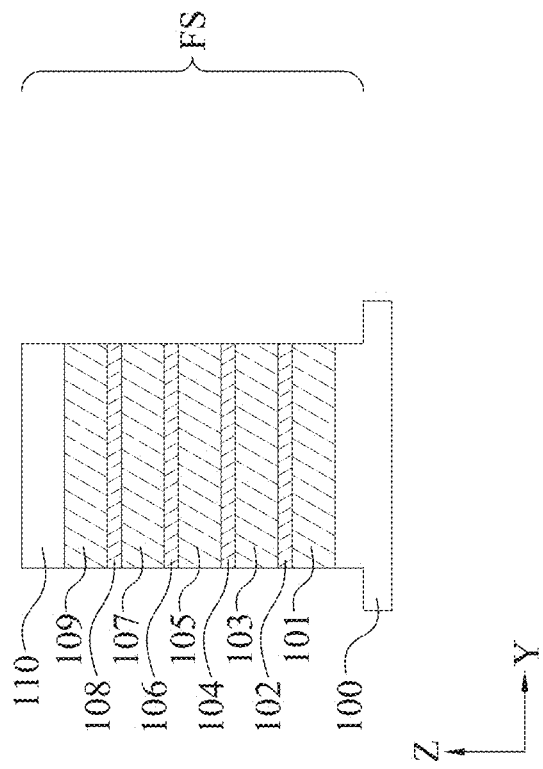

After forming the patterned mask 110, a patterning process is performed on the layer stack to form a fin structure FS, as illustrated in FIGS. 3A and 3B. In some embodiments, the patterning process comprises one or more etching processes, where the patterned mask layer 110 is used as an etch mask. The one or more etching processes may include wet etching processes, anisotropic dry etching processes, or combinations thereof, and may use one or more etchants that etch the first and second semiconductor layers 101-109 at a faster etch rate than it etches the patterned mask layer 110. Although the fin structure FS illustrated in FIG. 3B has vertical sidewalls, the etching process may lead to tapered sidewalls, as indicated by dash line DL1, in some other embodiments.

Figure 4B:
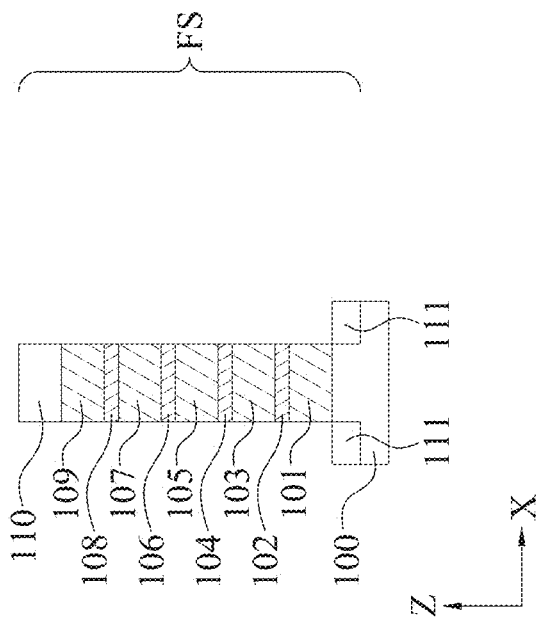
Figure 4A:
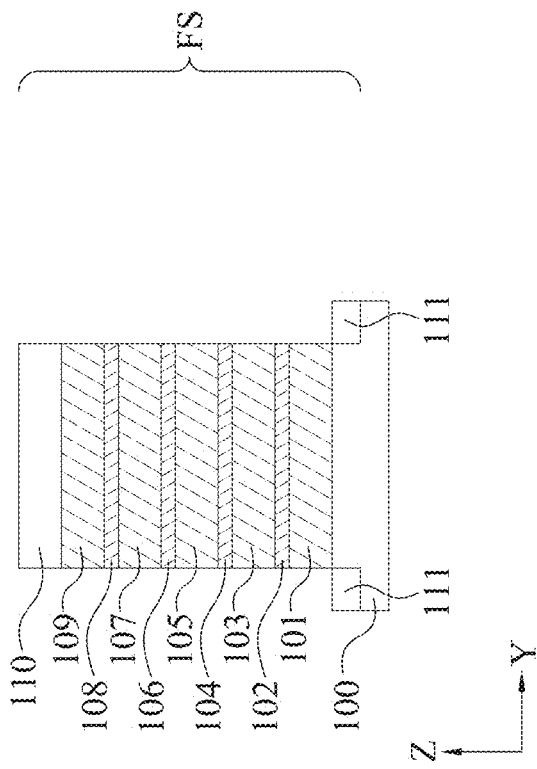

Once the fin structure FS has been formed, shallow trench isolation (STI) regions 111 (interchangeably referred to as isolation insulation layer) are formed around a lower portion of the fin structure FS are illustrated in FIGS. 4A and 4B. STI regions 111 may be formed by depositing one or more dielectric materials (e.g., silicon oxide) to completely fill the trenches around the fin structures FS and then recessing the top surface of the dielectric materials. The dielectric materials of the STI regions 111 may be deposited using a high density plasma chemical vapor deposition (HDP-CVD), a low-pressure CVD (LPCVD), sub-atmospheric CVD (SACVD), a flowable CVD (FCVD), spin-on coating, and/ or the like, or a combination thereof. After the deposition, an anneal process or a curing process may be performed. In some cases, the STI regions 111 may include a liner such as, for example, a thermal oxide liner grown by oxidizing the silicon surface or silicon germanium surface of the fin structure FS and the substrate 100. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI regions 111 such that an upper portion of the fin structure FS protrudes from surrounding insulating STI regions 111.

Figure 5B:
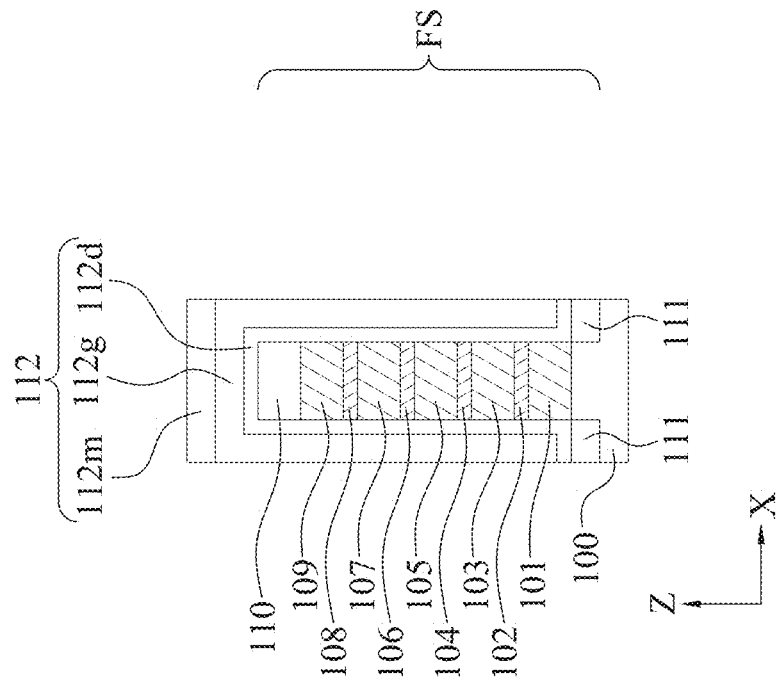
Figure 5A:
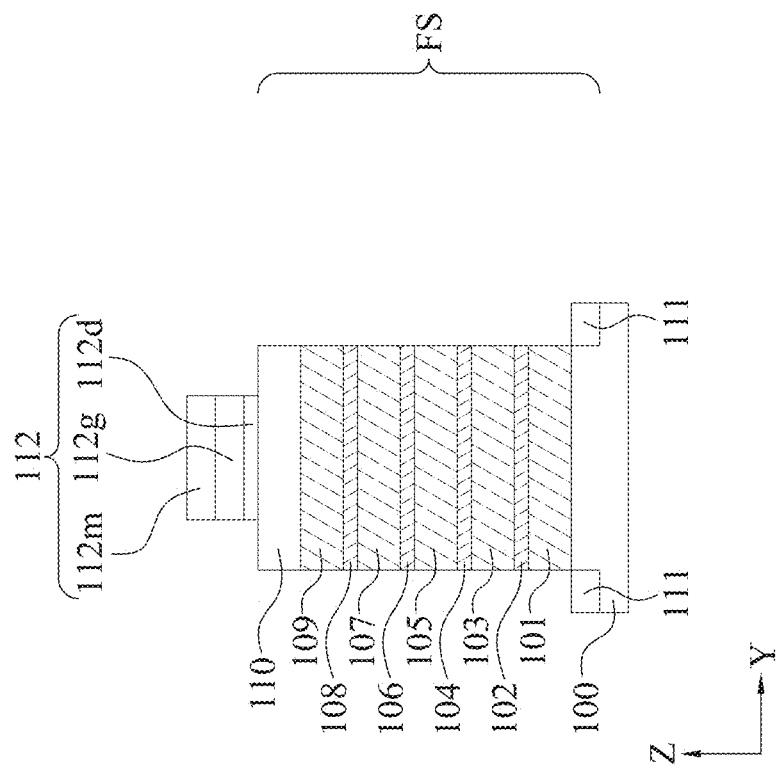

Once the STI regions 111 have been formed, a dummy gate structure 112 is formed over the fin structure FS, as illustrated in FIGS. 5A and 5B. The dummy gate structure 112 has a lengthwise direction perpendicular to the lengthwise direction of the fin structure FS. The dummy gate structure 112 includes a dummy gate dielectric layer 112d, a dummy gate electrode layer 112g over the dummy gate dielectric layer 112d and a hard mask layer 112m. The dummy gate dielectric layer 112d may be, for example, silicon oxide, silicon nitride, a combination thereof, or the like, and may be deposited or thermally grown according to acceptable techniques. The dummy gate layer 112g can be deposited over the dummy dielectric layer 112d and then planarized, such as by a CMP process. The hard mask layer 112m may be deposited over the dummy gate layer 112g. The dummy gate electrode layer 112g may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate electrode layer 112g may be deposited by physical vapor deposition (PVD), CVD, sputter deposition, or the like. The hard mask layer 112m may include, for example, silicon nitride, silicon oxynitride, or the like.

Once the dummy gate dielectric layer 112d, the dummy gate electrode layer 112g and the hard mask layer 112m have been deposited, the hard mask layer 112m is patterned using acceptable photolithography and etching techniques to form a hard mask. The pattern of the hard mask is then transferred to the underlying dummy gate electrode layer 112g and dummy gate dielectric layer 112d by an acceptable etching technique to form the dummy gate structure 112 having a longitudinal axis extending in X-direction perpendicular to the longitudinal axis of the fin structure FS that extends in Y-direction.

In a subsequent step, the exposed fin mask 110 and underlying fin structure FS that extend laterally beyond the dummy gate structure 112 along Y-direction are removed, for example, in an anisotropic etch step until the substrate 100 is exposed. The resulting structure is illustrated in FIGS. 6A and 6B. The etching is performed using an etchant that attacks the mask 110 and fin structure FS, and hardly attacks the gate hard mask 112m. Stated differently, the gate hard mask 112m has higher etch resistance to the etching process than that of the fin mask 110 and fin structure FS. Accordingly, in the etching step, the height of gate structure 112 is substantially not reduced. Although the resulting fin structure FS illustrated in FIG. 6A has vertical sidewalls, the etching process may lead to tapered sidewalls, as indicated by dash line DL2, in some other embodiments.

In some embodiments, the fin structure FS may be etched by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the fin structure FS at a faster etch rate than it etches the gate hard mask 112m. After etching the fin structure FS is complete, a cleaning process is optionally performed on the exposed substrate 100 to remove any possible oxide formation on the silicon surface by using, for example, a diluted hydrofluoric acid (HF) solution.

In a subsequent step, a silicon germanium epitaxial process is performed to epitaxially grow source/drain stressors 117 having a plurality of epitaxial silicon germanium layers, such as layers 113, 114, 115 and 116, on the exposed substrate 100, as illustrated in FIGS. 7A-10B. Formation of the silicon germanium layers (interchangeably referred to as regrown source/drain layers) 113, 114, 115 and 116 is performed "in-situ" without interrupting an epitaxial process. The silicon germanium layers 113-116 have different atomic ratios of germanium to silicon (i.e., different germanium atomic concentration), which in turn reduces the strain mismatch among the semiconductor nanosheets.

Figure 7B:
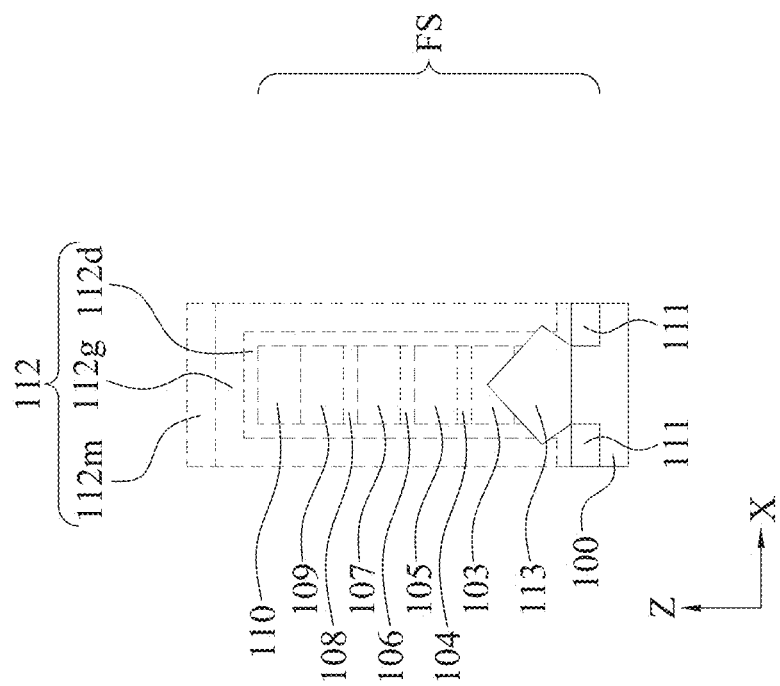
Figure 7A:
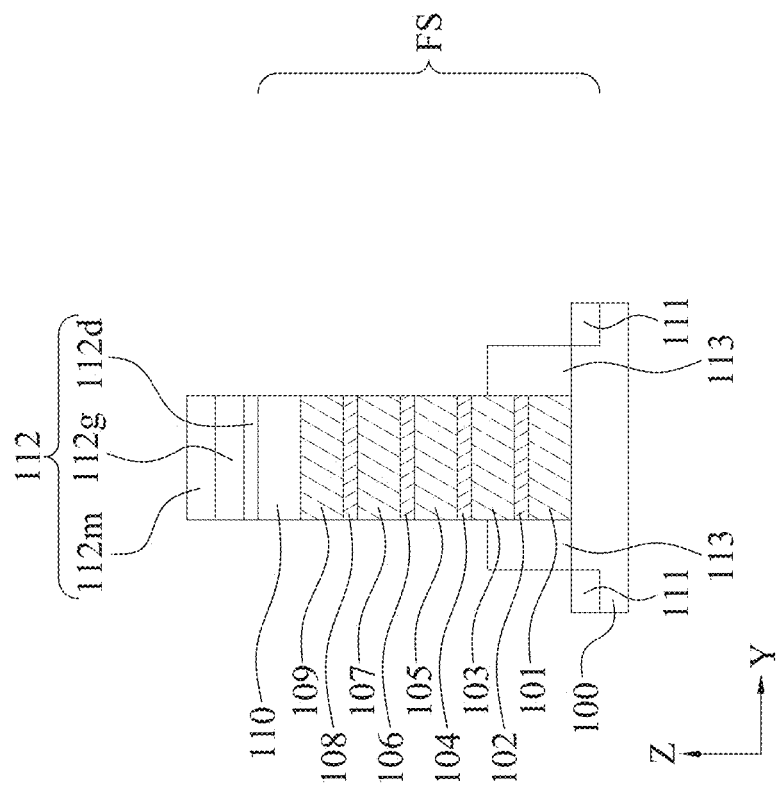
Figure 8B:
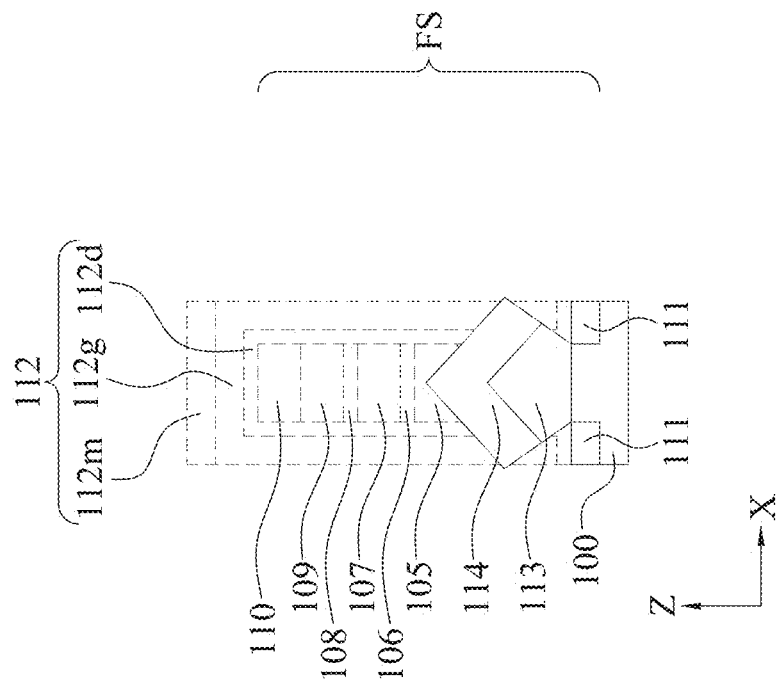
Figure 8A:
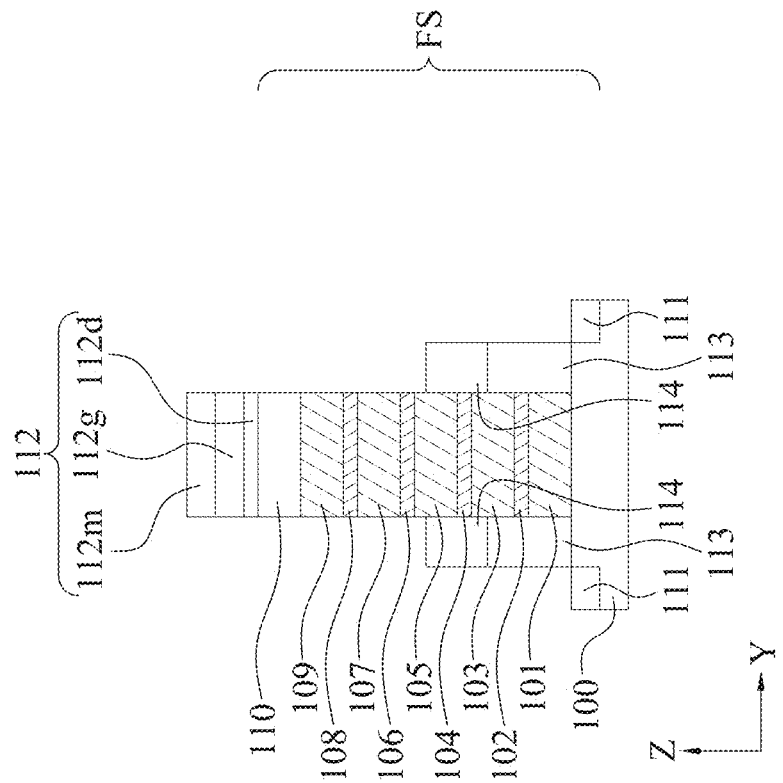

The Ge-to-Si atomic ratio difference among the layers 113-116 can be achieved by modifying a flow rate ratio between the germanium precursor gas and the silicon precursor during a continuous epitaxial growth. For example, at an initial stage of the continuous epitaxial growth, the silicon germanium layer 113 is formed at a first process condition, as illustrated in FIGS. 7A and 7B. The in-situ epitaxial process then continues at a second process condition and the next silicon germanium layer 114 is formed over the silicon germanium layer 113, as illustrated in FIGS. 8A and 8B. The in-situ epitaxial process then continues at a third process condition and the next silicon germanium layer 115 is formed over the silicon germanium layer 114, as illustrated in FIGS. 9A and 9B. The in-situ epitaxial process then continues at a fourth process condition and the next silicon germanium layer 116 is formed over the silicon germanium layer 115, as illustrated in FIGS. 10A-10B. The first, second, third and fourth process conditions are different at least in the flow rate ratio of a Ge precursor gas to a Si precursor gas, so that the layers 113-116 have different Ge-to-Si atomic ratios.

These silicon germanium layers 113-116 are grown in a bottom-up fashion. For example, silicon germanium layers 113-116 can be grown by an epitaxial deposition/partial etch process, which repeats the epitaxial deposition/partial etch process at least once. Such repeated deposition/partial etch process is also called a cyclic deposition-etch (CDE) process. In some embodiments, these silicon germanium layers 113-116 are grown by selective epitaxial growth (SEG), where an etching gas is added to promote the selective growth of silicon germanium from the exposed top surface of the substrate 100 that is parallel with the (100) crystal plane, but not from the sidewalls of the fin structure FS that are parallel with the (110) crystal plane. For example, the silicon germanium layers 113-116 are epitaxially grown using reaction gases such as HCl as an etching gas, $GeH_4$ as a Ge precursor gas, DCS and/or $SiH_4$ as a Si precursor gas, $B_2H_6$ as B dopant (i.e., p-type dopant) precursor, $H_2$, and/or $N_2$. In some embodiments, the etching gas may be other chlorine-containing gases or bromine-containing gases such as $Cl_2$, $BCl_3$, $BiCl_3$, $BiBr_3$ or the like.

The growth rate on the horizontal surface of the substrate 100 is different from the growth rate on the vertical sidewalls of the fin structure FS due to the different crystal plane orientations. For example, silicon germanium growth on the (100) crystal plane (e.g., horizontal surface of the substrate 100) is at least about three times (3×) faster than the silicon germanium growth on the (110) crystal plane (e.g., sidewalls of the fin structure FS). Accordingly, the bottom-up growth process incorporates the etching gas to promote bottom-up silicon germanium growth by preventing silicon germanium from growing on the sidewalls of the fin structure FS. For example, silicon germanium is grown from the horizontal surface of the substrate 100 at a higher rate than that of silicon germanium grown from the sidewalls of the fin structure FS. The etching gas removes the silicon germanium grown from the sidewalls of the fin structure FS as well as some silicon germanium grown from the horizontal surface of the substrate 100 at comparable etch rates. However, since the silicon germanium growth rate from the horizontal surface of the substrate 100 is faster than from the sidewalls of the fin structure FS, the net effect is that silicon germanium will substantially grow from the bottom-up. By way of example and not limitation, in each deposition-etch cycle of the CDE process, the etching step stops once the sidewalls of the fin structure FS are exposed, and the silicon germanium grown from the horizontal surface of the substrate 100 remains on the substrate 100 because it is thicker than the silicon germanium grown from sidewalls of the fin structure FS. In this way, the bottom-up growth can be realized.

To achieve different atomic ratios of germanium to silicon in these layers 113-116, a ratio of a flow rate of the Ge precursor gas (e.g., $GeH_4$) to a flow rate of the Si precursor gas (e.g., $SiH_4$) is varied for their respective growth processes. For example, a Ge-to-Si precursor flow rate ratio during the epitaxial growth of the layer 114 is greater than that of the layer 113, a Ge-to-Si precursor flow rate ratio during the epitaxial growth of the layer 115 is greater than that of the layer 114, and a Ge-to-Si precursor flow rate ratio during the epitaxial growth of the layer 116 is greater than that of the layer 115. In this way, the Ge-to-Si atomic ratio of the layer 116 is greater than that of the layer 115, the Ge-to-Si atomic ratio of the layer 115 is greater than that of the layer 114, and the Ge-to-Si atomic ratio of the layer 114 is greater than that of the layer 113. By way of example and not limitation, the layer 113 is $Si_{0.45}Ge_{0.55}$, the layer 114 is $Si_{0.44}Ge_{0.56}$, the layer 115 is $Si_{0.43}Ge_{0.57}$, and the layer 116 is $Si_{0.40}Ge_{0.60}$.

The channel layer 102 (e.g., silicon layer) is in contact with the silicon germanium layer 113 and thus the silicon germanium layer 113 can induce a compressive strain in the channel layer 102. This is because the intrinsic lattice constant of germanium is larger than that of silicon. For similar reasons, the channel layer 104 in contact with the silicon germanium layer 114, the channel layer 106 in contact with the silicon germanium layer 115, and the channel layer 108 in contact with the silicon germanium layer 116 experience compressive strains.

In some embodiments, the channel layer 102 is spaced from the silicon germanium layers 114, 115 and 116, so that the silicon germanium layer 113 dominates the compressive strain in the channel layer 102. Similarly, the channel layer 104 is spaced from the silicon germanium layer 113, 115 and 116, and thus the silicon germanium layer 114 dominates the compressive strain in the channel layer 104. The channel layer 106 is spaced from the silicon germanium layer 113, 114 and 116 and thus experiences a compressive strain dominated by the silicon germanium layer 115. The channel layer 108 is spaced from the silicon germanium layer 113, 114 and 115 and thus experiences a compressive strain dominated by the silicon germanium layer 116.

It is observed that if the channel layers of a GAA FET are disposed between SiGe stressors with a uniform Ge-to-Si atomic ratio, the higher channel layer would experience the lower compressive strain, thus leading to compressive strain mismatch among the channel layers. However, because the layer 116 has a greater Ge-to-Si atomic ratio than the underlying layer 115, the layer 115 has a greater Ge-to-Si atomic ratio than the underlying layer 114, and the layer 114 has a greater Ge-to-Si atomic ratio than the underlying layer 113, the compressive strain mismatch among the channel layers 102, 104, 106 and 108 can be alleviated, which in turn improves uniformity of the carrier mobility among the channel layers 102, 104, 106 and 108.

In some embodiments, the alloy composition in each silicon germanium layer is substantially uniform. For example, the layer 113 is $Si_{0.45}Ge_{0.55}$ in each position in the layer 113, the layer 114 is $Si_{0.44}Ge_{0.56}$ in each position in the layer 114, the layer 115 is $Si_{0.43}Ge_{0.57}$ in each position in the layer 115, and the layer 116 is $Si_{0.40}Ge_{0.60}$ in each position in the layer 116. In some other embodiments, the alloy composition in each silicon germanium layer is graded. In some embodiments, at least one silicon germanium layer can be undoped, or doped with p-type dopant (e.g., boron or gallium) by in-situ doping simultaneously with epitaxial growth, ion implantation after epitaxial growth, or both. In some embodiments, the dopant profile (e.g., boron concentration profile) in each silicon germanium can be a box profile, Gaussian profile, erf profile, or the like. In some embodiments, each silicon germanium layer can be strained or partially relaxed.

In some embodiments, thicknesses of the silicon germanium layers 113-116 each are in a range from about 5 nm to about 500 nm. In some embodiments, the thicknesses of the silicon germanium layers 113-116 are the same or different. In some embodiments, when viewed in a cross section taken along a direction perpendicular to a longitudinal axis of the fin structure FS (e.g., the cross sectional view as shown in FIG. 10B), the geometry of the bottom silicon germanium layer 113 can be a diamond shape, a circular shape, a polygonal shape, or the like. In some embodiments, when viewed in the cross section taken along the direction perpendicular to the longitudinal axis of the fin structure FS, the upper silicon germanium layers 114, 115 and 116 can be a Λ-shape, a rounded shape, a polygonal shape, or the like.

Due to different growth rates on different surface planes, facets may be formed. For example, the growth rate on surfaces having (111) surface orientations is lower than that of other planes such as (110) and (100) planes. Accordingly, when viewed in a cross section as shown in FIG. 10B, the resultant source/drain stressors 117 have facets 117u and 117d, which have the (111) surface orientations (in other word, on (111) planes). Throughout the description, the facets 117u, which face away from the substrate 100, are referred to as up-slant facets, while the facets 117d, which face toward the substrate 100, are referred to as down-slant facets. The down-slant facets 117d and the respective top surfaces of STI regions 111 may have an angle α, which may be from about 50 degrees to about 60 degrees. Although the depicted source/drain stressors have facets with (111) surface orientations, the facets of the source/drain stressors may have {311}, {100}, {911} facets or rounded surface in some other embodiments, depending on process conditions of the epitaxial growth.

In some embodiments where the channel layers 102, 104, 106 and 108 are made of silicon, the regrown source/drain layer 113 is $Si_{1-a}Ge_a$, the regrown source/drain layer 114 is $Si_{1-b}Ge_b$, the regrown source/drain layer 115 is $Si_{1-c}Ge_c$, and the regrown source/drain layer 116 is $Si_{1-d}Ge_d$, where $0.3 \leq a < b < c < d \leq 0.8$.

In some embodiments where the channel layers 102, 104, 106 and 108 are made of silicon germanium, the channel layers 102, 104, 106 and 108 may have lower germanium atomic concentration (or lower germanium-to-silicon atomic ratio) than that of the regrown source/drain layers 113-116, so that the regrown source/drain layers 113-116 can induce compressive strain in the respective channel layers 102, 104, 106 and 108, which in turn will increase hole mobility in the channel layers 102, 104, 106 and 108, thus improving the device performance of a resultant p-type GAA FET. By way of example and not limitation, the channel layers 102, 104, 106 and 108 are $Si_{1-x}Ge_x$, where $0<x<1$, and the regrown source/drain layers 113/114/115/116 are respectively $Si_{1-a}Ge_a/Si_{1-b}Ge_b/Si_{1-c}Ge_c/Si_{1-d}Ge_d$, where $0.3 \leq a < b < c < d \leq 1$, and $x < a < b < c < d$.

Although the source/drain layers 113-116 discussed above are silicon germanium, the source/drain layers 113-116 may be other materials in some other embodiments. For example, in some embodiments where the channel layers 102, 104, 106 and 108 are made of germanium tin (GeSn), the regrown source/drain layers 113-116 are made of germanium tin as well, but have a higher tin atomic concentration (or higher tin-to-germanium atomic ratio) than that of the channel layers 102, 104, 106 and 106, so as to induce compressive strain to the respective channel layers 102, 104, 106 and 108, thus improving the hole mobility of a resultant p-type GAA FET. By way of example and not limitation, the channel layers 102, 104, 106 and 108 are $Ge_{1-x}Sn_x$, where $0<x<0.3$, and the regrown source/drain layers 113/114/115/116 are respectively $Ge_{1-a}Sn_a/Ge_{1-b}Sn_b/Ge_{1-c}Sn_c/Ge_{1-d}Sn_d$, where $0<a<b<c<d \leq 0.3$, and $x<a<b<c<d$. In such embodiments, the source/drain layer 113 is epitaxially grown at a first flow rate ratio of a tin precursor gas (e.g., $SnCl_4$) to a germanium precursor gas (e.g., $GeH_4$), the source/drain layer 114 is epitaxially grown at a second Sn-to-Ge precursor flow rate ratio greater than the first Sn-to-Ge precursor flow rate ratio, the source/drain layer 115 is epitaxially grown at a third Sn-to-Ge precursor flow rate ratio greater than the second Sn-to-Ge precursor flow rate ratio, and the source/drain layer 116 is epitaxially grown at a fourth Sn-to-Ge precursor flow rate ratio greater than the third Sn-to-Ge precursor flow rate ratio.

In some other embodiments, the channel layers 102, 104, 106 and 108 are made of silicon, and the source/drain layers 113-116 are made of silicon phosphorous. Therefore, the regrown source/drain layers 113-116 can induce tensile strain in the respective channel layers 102, 104, 106 and 108, which in turn will increase electron mobility in the channel layers 102, 104, 106 and 108, thus improving the device performance of a resultant n-type GAA FET. By way of example and not limitation, the channel layers 102, 104, 106 and 108 are silicon, and the regrown source/drain layers 113/114/115/116 are respectively $Si_{1-a}P_a/Si_{1-b}P_b/Si_{1-c}P_c/Si_{1-d}P_d$, where $0.002 \leq a < b < c < d \leq 0.2$. In such embodiments, the source/drain layer 113 is epitaxially grown at a first flow rate ratio of a phosphorous precursor gas (e.g., $PH_3$) to a silicon precursor gas (e.g., $SiH_4$), the source/drain layer 114 is epitaxially grown at a second P-to-Si precursor flow rate ratio greater than the first P-to-Si precursor flow rate ratio, the source/drain layer 115 is epitaxially grown at a third P-to-Si precursor flow rate ratio greater than the second P-to-Si precursor flow rate ratio, and the source/drain layer 116 is epitaxially grown at a fourth P-to-Si precursor flow rate ratio greater than the third P-to-Si precursor flow rate ratio. In some other embodiments of an n-type GAA FET, the source/drain layers 113-116 may be made of arsenic doped silicon.

Once the source/drain stressors 117 have been formed, the dummy gate structure 112 and the mask 110 are removed to expose the fin structure FS. The resulting structure is shown in FIGS. 11A and 11B. The dummy gate structure 112 may be removed, for example, using a selective etching process that etches the dummy gate structure 112 at a faster etch rate than it etches other materials on the substrate 100. After the dummy gate structure 112 is removed to expose the mask 110, the mask 110 is removed, for example, using another selective etching process that etches the mask 110 at a faster etch rate than it etches other materials on the substrate 100.

In some embodiments, another mask 118 can be optionally formed over the source/drain stressors 117 before etching the dummy gate structure 112. In this way, the source/drain stressors 117 can be protected against the etchants used in removal of the dummy gate structure 112 and the mask 110. The mask 118 may be formed using depositing a mask layer over the substrate 100, followed by patterning the mask layer into the patterned mask 118 using suitable photolithography and etching techniques. The patterned mask 118 includes silicon nitride ($Si_3N_4$), silicon oxide, the like, or combinations thereof.

Afterwards, the buffer layers 101, 103, 105, 107 and 109 are removed by a selective etching process, using the mask 118 as an etching mask, thus forming openings 119 between neighboring channel layers 102, 104, 106 and 108. The resultant structure is illustrated in FIGS. 12A and 12B. In this way, the channel layers 102, 104, 106 and 108 become suspended over the substrate 100 and between the source/drain stressors 117. This step can be interchangeably referred to as a channel release process. At this interim processing step, the openings 119 may be filled with ambient environment conditions (e.g., air, nitrogen, etc). The selective etching process removes the material of the buffer layers 101, 103, 105, 107 and 109 (e.g., $Si_{0.8}Ge_{0.2}$) at a faster rate than or without removing the material of the channel layers 102 (e.g., silicon). By way of example and not limitation, the etch process may include a wet etch process using an etchant such as hydrogen peroxide ($H_2O_2$), ammonium hydroxide ($NH_4OH$), tetramethylalammonium hydroxide (TMAH), or another etchant. In some embodiments, the etch process may include a chemical vapor etch process using high-temperature HCl gas. In still further embodiments, the etch process may include an RIE process using a plasma produced from $CF_4$ gas. After the channel release process is complete, the patterned mask 118 may be removed using a selective etching process, such as a wet etching process using hot $H_3PO_4$ if the mask 118 is made of silicon nitride.

Figure 13B:
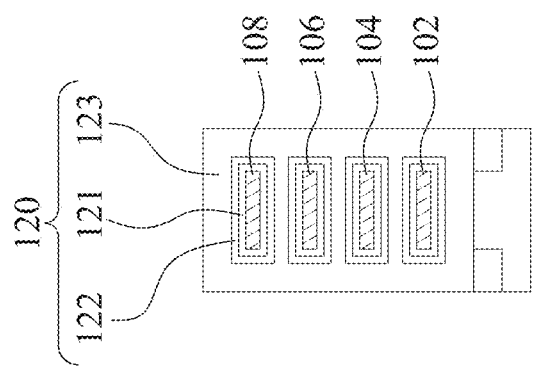
Figure 13A:
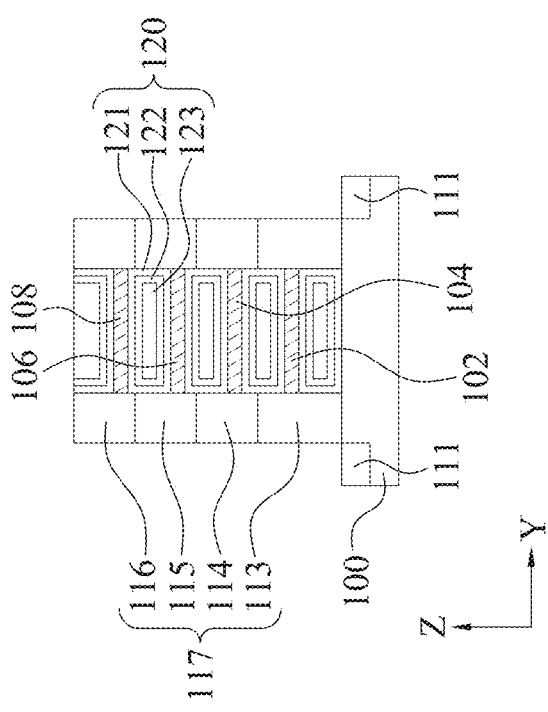

Afterwards, a gate structure is formed, as illustrated in FIGS. 13A and 13B. The gate structure may be the final gate of a GAA FET. The final gate structure may be a high-k/metal gate stack, however other compositions are possible. In some embodiments, the gate structure forms the gate associated with the multi-channels provided by the plurality of nanosheets (now having openings therebetween) in the channel region. For example, a high-k/metal gate structure 120 is formed within the openings 119 provided by the release of nanosheets 102, 104, 106 and 108. In various embodiments, the high-k/metal gate structure 120 includes a gate dielectric layer 121 formed around the nanosheets 102, 104, 106 and 108, a work function metal layer 122 formed over the gate dielectric layer 121, and a fill metal 123 formed over the work function metal layer 122. The gate dielectric layer 121 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The work function metal layer and/or fill metal layer used within high-k/metal gate stack may include a metal, metal alloy, or metal silicide. Additionally, the formation of the high-k/metal gate stack may include depositions to form various gate materials, one or more liner layers, and one or more CMP processes to remove excessive gate materials. As illustrated in FIG. 13B, the resultant high-k/metal gate stack 120 surrounds each nanosheet 102, 104, 106 and 108, and thus is referred to as a GAA FET.

In some embodiments, the interfacial layer of the gate dielectric layer 121 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 121 may include hafnium oxide ($HfO_2$). Alternatively, the gate dielectric layer 121 of the gate stack 120 may include other high-k dielectrics, such as hafnium silicon oxide (HfSiO), hafnium oxynitride (HfON), hafnium silicon oxynitride (HfSiON), hafnium tantalum oxide (HfTaO), hafnium titanium oxide (HfTiO), hafnium zirconium oxide (HfZrO), lanthanum oxide ($La_2O_3$), zirconium oxide ($ZrO_2$), titanium oxide ($TiO_2$), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The work function metal layer 122 may include work function metals to provide a suitable work function for the high-k/metal gate stack 120. For an n-type GAA FET, the work function metal layer 122 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), tungsten (W), metal carbides (e.g., hafnium carbide (HfC), zirconium carbide (ZrC), titanium carbide (TiC), aluminum carbide (AlC), tungsten carbide (WC)), aluminides, and/or other suitable materials. On the other hand, for a p-type GAA FET, the work function metal layer 122 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

The fill metal 123 may exemplarily include, but are not limited to, tungsten, aluminum, copper, nickel, cobalt, titanium, tantalum, titanium nitride, tantalum nitride, tungsten nitride, nickel silicide, cobalt silicide, TaC, TaSiN, TaCN, TiAl, TiAlN, or other suitable materials.

Figure 14:
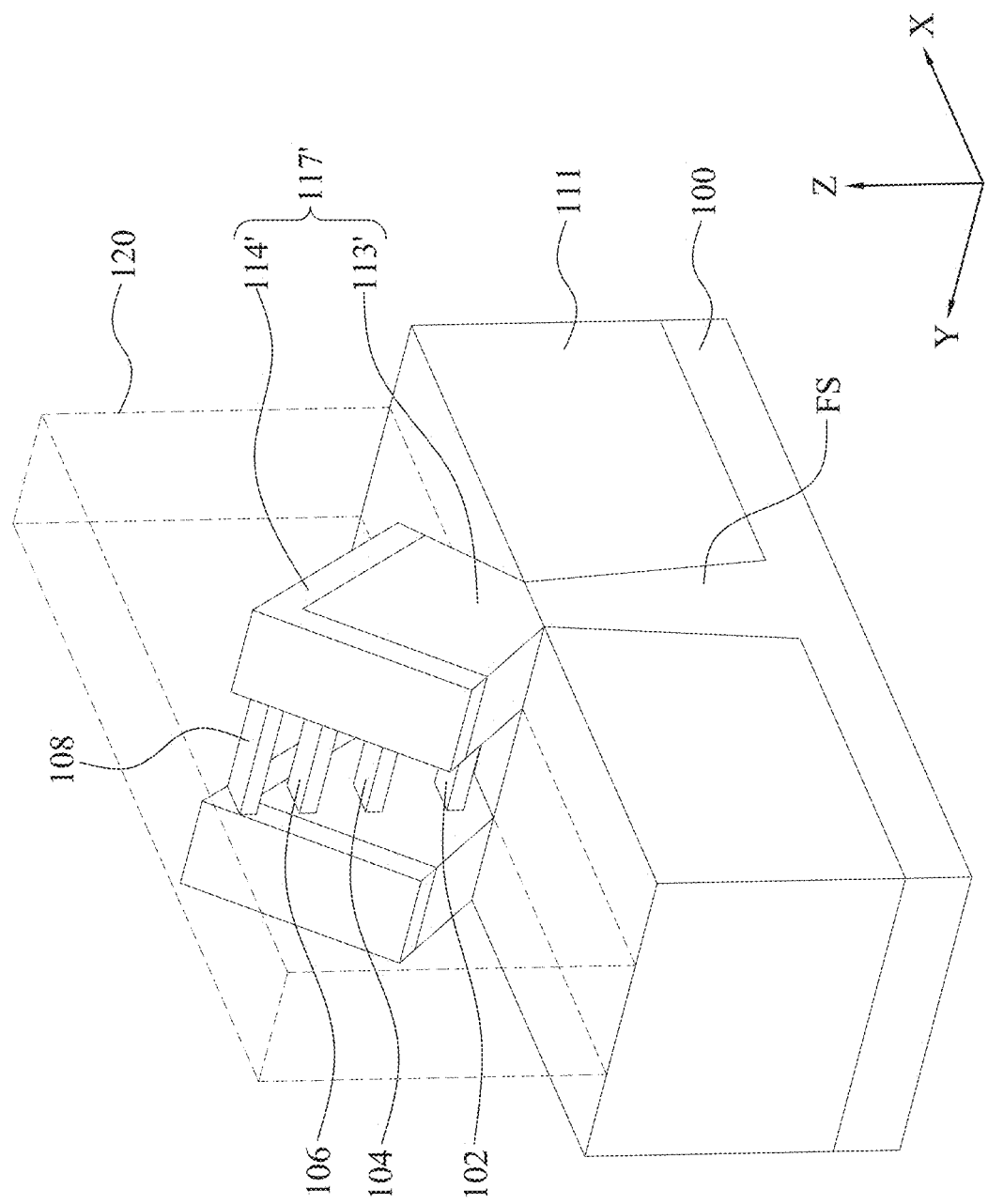
FIG. 14 shows a perspective view of a GAA FET according to some other embodiments of the present disclosure.

Although the source/drain stressors in the embodiments discussed above include four epitaxial source/drain layers, the source/drain stressor in some other embodiments can include more than four or less than four epitaxial source/drain layers. For example, FIG. 14 shows a perspective view of a GAA FET according to some other embodiments of the present disclosure. FIG. 14 shows substantially the same structure as FIG. 1, except that the source/drain stressors 117' include two regrown source/drain layers 113' and 114', rather than four source/drain layers as illustrated in FIG. 1. The regrown source/drain layers 113' and 114' are silicon germanium but have different germanium-to-silicon atomic ratios. For example, the regrown source/drain layer 113' is $Si_{0.45}Ge_{0.55}$, and the regrown source/drain layer 114' is $Si_{0.40}Ge_{0.60}$. Because the upper regrown layer 114' has a greater germanium-to-silicon atomic ratio than the lower regrown layer 113', the compressive strain mismatch among the nanosheets 102, 104, 106 and 108 can be reduced.

Figure 15:
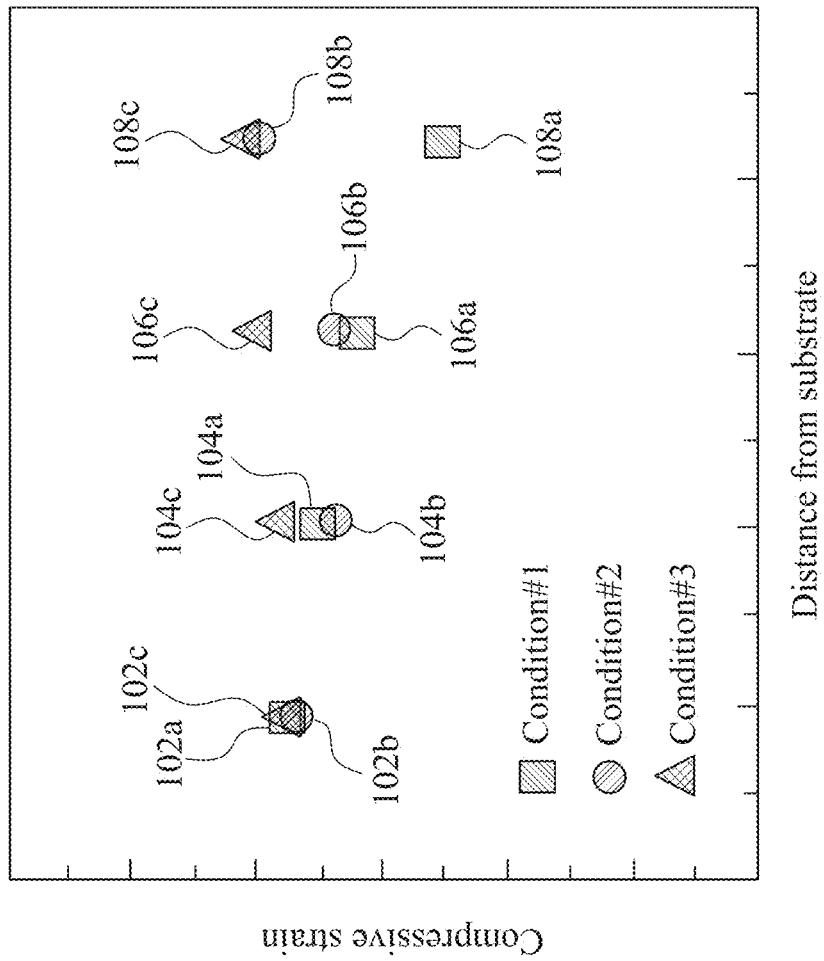
FIG. 15 is a graph illustrating simulation results showing compressive strains in different nanosheets of a p-type GAA FET according to some embodiments of the present disclosure.

FIG. 15 illustrates simulation results showing compressive strains in different nanosheets of a p-type GAA FET, wherein the compressive strain is shown on the vertical axis in FIG. 15, and the vertical distance from the substrate is shown on the horizontal axis in FIG. 15. In Condition #1, the vertically arranged nanosheets 102a, 104a, 106a and 108a are laterally disposed between two source/drain stressors, where the source/drain stressors each consisting of substantially uniform $Si_{0.45}Ge_{0.55}$. In Condition #2, the vertically nanosheets 102b, 104b, 106b and 108b are laterally disposed between two source/drain stressors each consisting of a regrown $Si_{0.45}Ge_{0.55}$ layer and a regrown $Si_{0.40}Ge_{0.60}$ layer over the $Si_{0.45}Ge_{0.55}$ layer, such as the source/drain stressors 117' as illustrated in FIG. 14. In Condition #3, the vertically arranged nanosheets 102c, 104c, 106c and 108c are laterally disposed between two source/drain stressors each consisting of a regrown $Si_{0.45}Ge_{0.55}$ layer, a regrown $Si_{0.44}Ge_{0.56}$ layer over the $Si_{0.45}Ge_{0.55}$ layer, a regrown $Si_{0.43}Ge_{0.57}$ layer over the $Si_{0.44}Ge_{0.56}$ layer, and a regrown $Si_{0.40}Ge_{0.60}$ layer over the $Si_{0.43}Ge_{0.57}$ layer, such as the source/drain stressors 117 illustrated in FIG. 1.

In Condition #1, the compressive strain of the nanosheet 104a is lower than that of the nanosheet 102a, the compressive strain of the nanosheet 106a is lower than that of the nanosheet 104a, and the compressive strain of the nanosheet 108a is lower than that of the nanosheet 106a. This proves that the higher nanosheet (i.e., farther from the substrate) experiences the lower compressive strain, if the source/drain stressors are made of uniform $Si_{0.45}Ge_{0.55}$.

Comparing Condition #2 with Condition #1, the top nanosheet 108b in Condition #2 has a greater compressive strain than that of the top nanosheet 108a in Condition #1. This proves that the source/drain stressor consisting of a regrown $Si_{0.45}Ge_{0.55}$ layer and a regrown $Si_{0.40}Ge_{0.60}$ layer over the $Si_{0.45}Ge_{0.55}$ layer induces an increased compressive strain in the top nanosheet, as compared with the source/drain stressors each consisting of uniform $Si_{0.45}Ge_{0.55}$. Moreover, a maximum compressive strain difference among the nanosheets 102b, 104b, 106b and 108b (e.g., compressive strain difference between the nanosheet 108b and 104b) in Condition #2 is lower than a maximum compressive strain difference among the nanosheets 102a, 104a, 106a and 108a (e.g., compressive strain difference between the nanosheet 108a and 102a) in Condition #1. This proves that the compressive strain mismatch among the nanosheets in a GAA FET is reduced by the source/drain stressor consisting of a regrown $Si_{0.45}Ge_{0.55}$ layer and a regrown $Si_{0.40}Ge_{0.60}$ layer over the $Si_{0.45}Ge_{0.55}$ layer.

Comparing with Condition #3 with Condition #1, the nanosheet 104c in Condition #3 has a greater compressive strain than that of the nanosheet 104a in Condition #1, the nanosheet 106c in Condition #3 has a greater compressive strain than that of the nanosheet 106a in Condition #1, and the nanosheet 108c in Condition #3 has a greater compressive strain than that of the nanosheet 108a in Condition #1. This proves that the source/drain stressor consisting of a regrown $Si_{0.45}Ge_{0.55}$ layer, a regrown $Si_{0.44}Ge_{0.56}$ layer over the $Si_{0.45}Ge_{0.55}$ layer, a regrown $Si_{0.43}Ge_{0.57}$ layer over the $Si_{0.44}Ge_{0.56}$ layer, and a regrown $Si_{0.40}Ge_{0.60}$ layer over the $Si_{0.43}Ge_{0.57}$ layer induces an increased compressive strain in the nanosheets 104, 106 and 108, as compared with the source/drain stressors each consisting of uniform $Si_{0.45}Ge_{0.55}$. Moreover, a maximum compressive strain difference among the nanosheets 102c, 104c, 106c and 108c (e.g., compressive strain difference between the nanosheet 108c and 102c) in Condition #3 is lower than a maximum compressive strain difference among the nanosheets 102a, 104a, 106a and 108a (e.g., compressive strain difference between the nanosheet 108a and 102a) in Condition #1. This proves that the compressive strain mismatch among the nanosheets in a GAA FET is reduced by the source/drain stressor consisting of a regrown $Si_{0.45}Ge_{0.55}$ layer, a regrown $Si_{0.44}Ge_{0.56}$ layer over the $Si_{0.45}Ge_{0.55}$ layer, a regrown $Si_{0.43}Ge_{0.57}$ layer over the $Si_{0.44}Ge_{0.56}$ layer, and a regrown $Si_{0.40}Ge_{0.60}$ layer over the $Si_{0.43}Ge_{0.57}$ layer.

The simulation results as illustrated in FIG. 15 is obtained by performing a simulation where the nanosheet length (measured in Y-direction as illustrated in FIG. 1) is set from about 25 nm to about 30 nm (e.g., about 28 nm), the nanosheet width (measured in X-direction as illustrated in FIG. 1) is set from about 23 nm to about 27 nm (e.g., about 25 nm), the nanosheet thickness (measured in Z-direction as illustrated in FIG. 1) is set from about 3 nm to about 7 nm (e.g., about 5 nm), and the nanosheet pitch (i.e., Z-directional distance between neighboring nanosheets as illustrated in FIG. 1) is set from about 20 nm to about 24 nm (e.g., about 22 nm). However, these dimensions are only intended to be illustrate and not intended to limit embodiments of the present disclosure. Rather, nanosheets having any other suitable dimension and/or any number of nanosheets can experience similar strain mismatch improvement. For example, the nanosheet pitch can be less than about 22 nm, such as about 11 nm or 16 nm, or be in a range from about 10 nm to about 40 nm. The nanosheet thickness can be greater than about 5 nm, such as about 10 nm, or be in a range from about 5 nm to about 10 nm. The nanosheet width can be in a range from about 5 nm to about 100 nm. The number of nanosheets can be in a range from about 2 to about 10.

Figure 16:
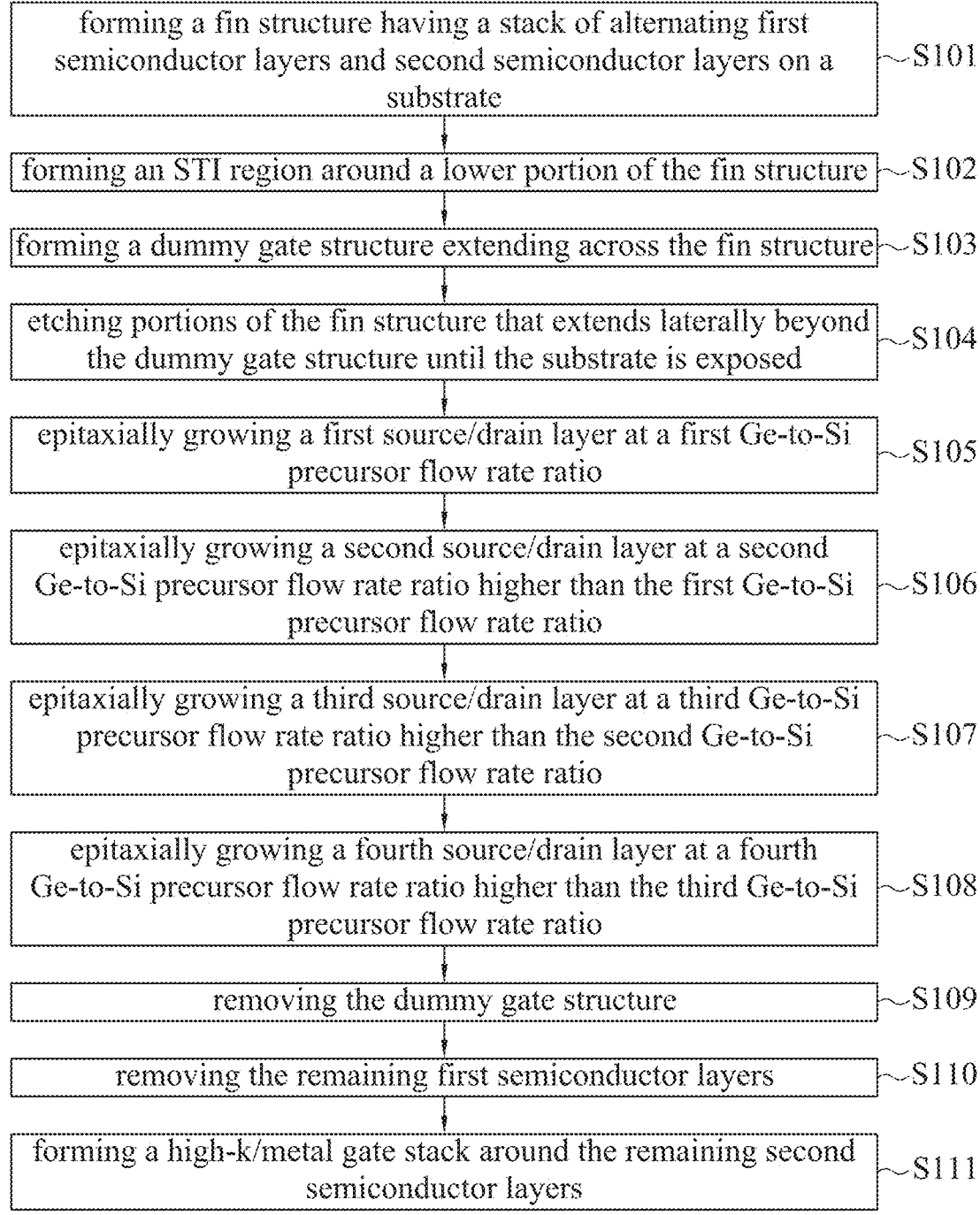
FIG. 16 is a flow chart illustrating a method of forming a GAA FET in accordance with some embodiments.

FIG. 16 illustrates a method M1 of forming a GAA FET in accordance with some embodiments. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, a fin structure is formed on a substrate. The fin structure has a stack of alternating first semiconductor layers and second semiconductor layers. FIGS. 2A-2B and 3A-3B illustrate cross-sectional views of some embodiments corresponding to act in block S101.

At block S102, an STI region is formed around a lower portion of the fin structure. FIGS. 4A-4B illustrate cross-sectional views of some embodiments corresponding to act in block S102.

At block S103, a dummy gate structure is formed extending across the fin structure. FIGS. 5A-5B illustrate cross-sectional views of some embodiments corresponding to act in block S103.

At block S104, portions of the fin structure that extend laterally beyond the dummy gate structure is etched until the substrate is exposed. FIGS. 6A-6B illustrate cross-sectional views of some embodiments corresponding to act in block S104.

At block S105, a first source/drain layer is epitaxially grown at a first Ge-to-Si precursor flow rate ratio. FIGS. 7A-7B illustrate cross-sectional views of some embodiments corresponding to act in block S105.

At block S106, a second source/drain layer is epitaxially grown at a second Ge-to-Si precursor flow rate ratio higher than the first Ge-to-Si precursor flow rate ratio. FIGS. 8A-8B illustrate cross-sectional views of some embodiments corresponding to act in block S106.

At block S107, a third source/drain layer is epitaxially grown at a third Ge-to-Si precursor flow rate ratio higher than the second Ge-to-Si precursor flow rate ratio. FIGS. 9A-9B illustrate cross-sectional views of some embodiments corresponding to act in block S107.

At block S108, a fourth source/drain layer is epitaxially grown at a fourth Ge-to-Si precursor flow rate ratio higher than the third Ge-to-Si precursor flow rate ratio. FIGS. 10A-10B illustrate cross-sectional views of some embodiments corresponding to act in block S108.

At block S109, the dummy gate structure is removed to expose the fin structure. FIGS. 11A-11B illustrate cross-sectional views of some embodiments corresponding to act in block S109.

At block S110, the remaining first semiconductor layers are removed to release the nanosheets formed from the remaining second semiconductor layers. FIGS. 12A and 12B illustrate a cross-sectional view and a perspective view of some embodiments corresponding to act in block S110.

At block S111, a high-k/metal gate stack is formed around nanosheets formed from the remaining second semiconductor layers. FIGS. 13A and 13B illustrate cross-sectional views of some embodiments corresponding to act in block S111.

FIGS. 17-30 show exemplary sequential processes for manufacturing a GAA FET according to some embodiments of the present disclosure. It is understood that additional operations can be provided before, during, and after processes shown by FIGS. 17-30, and some of the operations described below can be replaced or eliminated, for additional embodiments of the method. The order of the operations/processes may be interchangeable. FIGS. 17-30 illustrate a cross-sectional view along Y-direction corresponding to the line A-A illustrated in FIG. 1.

Figure 17:
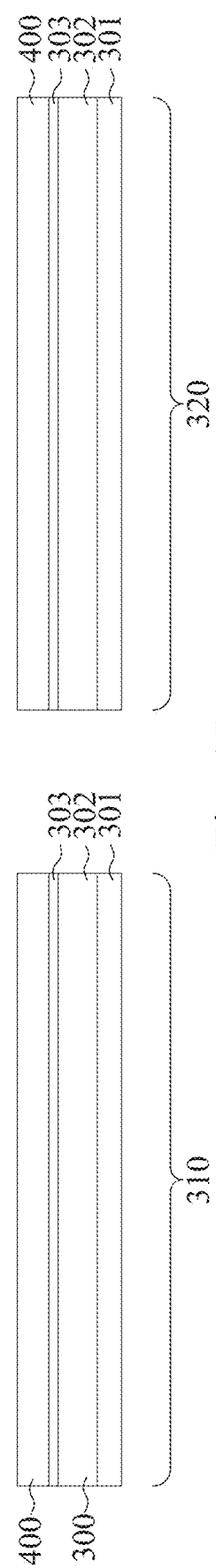

As illustrated in FIG. 17, a semiconductor substrate 300 is provided. In some embodiments, the substrate 300 may be a semiconductor substrate, such as a bulk semiconductor substrate, a semiconductor-on-insulator (SOI) substrate, a multi-layered or gradient substrate, or the like. The substrate 300 may include a semiconductor material, such as an elemental semiconductor including Si and Ge; a compound or alloy semiconductor including SiC, SiGe, GeSn, GaAs, GaP, GaAsP, AlInAs, AlGaAs, GaInAs, InAs, GaInP, InP, InSb, GaInAsP; a combination thereof, or the like. The substrate 300 may be doped or substantially un-doped. In a specific example, the substrate 300 is an SOI substrate having a buried oxide layer 302 over a bulk silicon substrate 301, and a doped semiconductor (e.g., silicon) layer 303 over the buried oxide layer 302. The doped silicon layer 303 is thinner than the buried oxide layer 302. For example, the doped silicon layer 303 has a thickness in a range from about 5 nm to about 15 nm (e.g., about 10 nm), and the buried oxide layer 302 has a thickness in a range from about 130 nm to about 160 nm (e.g., about 145 nm). The doped silicon layer 303 may be doped with an n-type dopant (e.g., phosphorous) or a p-type dopant (e.g., boron). The substrate 300 includes first and second device regions 310 and 320. The first device region 310 is an n-type transistor region, in which one or more n-type transistors such as one or more n-type GAA FETs are to be formed. The second device region 320 is a p-type transistor region, in which one or more p-type transistors such as one or more p-type GAA FETs are to be formed. As a result, the device region 310 can be referred to as an NFET region, and the device region 320 can be referred to as a PFET region.

In some embodiments where the substrate 300 is an SOI substrate, the silicon layer 303 in the NFET region 310 can be optionally doped with a p-type impurity (e.g., boron), and the silicon layer 303 in the PFET 320 region can be optionally doped with an n-type impurity (e.g., phosphorous or arsenic). The doped surface layer of the SOI substrate 300 is helpful to electrically isolate different transistors and/or different device regions, because the doped surface layer is doped with an impurity of a conductivity type opposite a conductivity type of subsequently formed source/drain regions. In some embodiments, the silicon layer 303 in the NFET region 310 has a p-type impurity concentration (e.g., boron concentration) in a range from about $1 \times 10^{14}$ cm$^{-3}$ to about $1 \times 10^{20}$ cm$^{-3}$ (e.g., about $1 \times 10^{15}$ cm$^{-3}$), and the silicon layer 303 in the PFET region 320 has an n-type impurity concentration (e.g., phosphorous concentration) in a range from about $1 \times 10^{14}$ cm$^{-3}$ to about $1 \times 10^{20}$ cm$^{-3}$ (e.g., about $1 \times 10^{15}$ cm$^{-3}$). In some embodiments, the NFET region 310 and the PFET region 320 are doped by using different ion implantation processes, wherein the NFET region 310 is covered by a mask (e.g., photoresist mask) during implanting an n-type impurity into the PFET region, and the PFET region 320 is covered by a mask (e.g., photoresist mask) during implanting a n-type impurity into the PFET region 320.

A strain-relaxed buffer layer 400 is formed on the semiconductor substrate 300 by using one or more epitaxy processes. The epitaxy processes include CVD deposition techniques (e.g., vapor-phase epitaxy (VPE) and/or ultrahigh vacuum CVD (UHV-CVD)), molecular beam epitaxy (MBE), and/or other suitable processes. The epitaxy duration time of forming the strain-relaxed buffer layer 400 is long enough such that the strain-relaxed buffer layer 400 has a minimum thickness (e.g., in a range from about 2 nm to about 500 nm) sufficient to form a relaxed layer having substantially zero value of strain. The strain-relaxed buffer layer 400 may be a Group IV material, such as Si, Ge, SiGe, SiGeSn, Sn or the like; a Group III-Group V compound material, such as GaAs, GaP, GaAsP, AlInAs, AlGaAs, GaInAs, InAs, GaInP, InP, InSb, GaInAsP or the like; SiP, combinations thereof, or the like. The strain-relaxed buffer layer 400 can be doped or substantially un-doped. In specific embodiments, the strain-relaxed buffer layer 400 may be formed of doped or substantially un-doped germanium.

In some embodiments, the strain-relaxed buffer layer 400 in the NFET region 310 can be doped with a p-type impurity (e.g., boron), and the strain-relaxed buffer layer 400 in the PFET 320 region can be doped with an n-type impurity (e.g., phosphorous or arsenic). The doped strain-relaxed buffer layer is helpful to electrically isolate different transistors and/or different device regions, because the doped strain-relaxed buffer layer is doped with an impurity of a conductivity type opposite a conductivity type of subsequently formed source/drain regions.

Figure 18:
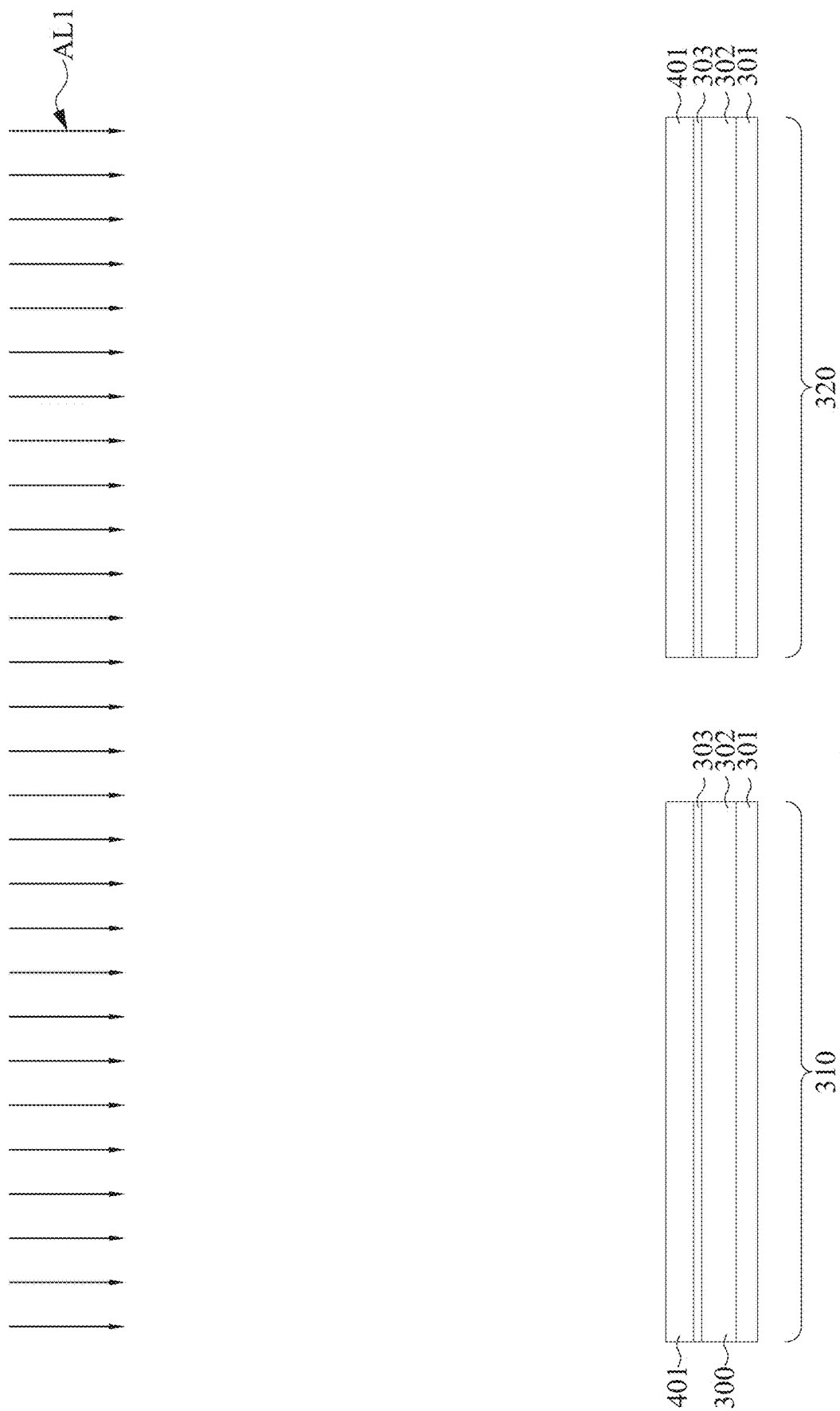

Once the strained-relaxed buffer layer 400 has been formed, an annealing process AL1 is performed on the strain-relaxed buffer layer 400 at a temperature from about 600 degrees Centigrade to about 1000 degrees Centigrade (e.g., about 800 degrees Centigrade), as illustrated in FIG. 18. The annealing process AL1 is helpful to confine crystallographic defects (e.g., threading dislocation defects, point defects, antiphase boundaries or the like) in the interface between the resultant buffer layer 401 and the substrate 300. After the annealing process AL1 is complete, the buffer layer 401 cools down to a predetermined temperature (e.g., room temperature such as about 25 degrees Centigrade). In some embodiments where the buffer layer 401 is made of a material (e.g., germanium) different from a material of the topmost layer 303 of the substrate 300 (e.g., silicon), the buffer layer 401 may obtain a tensile strain (e.g., about 0.05%-0.30% tensile strain) after the cooling down is complete. This is because of the mismatch among the thermal expansion coefficient of silicon and the thermal expansion coefficient of germanium.

Afterwards, a patterned mask ML1 is formed over the NFET region 310 while leaving the PFET region 320 exposed. The patterned mask ML1 may be formed using depositing a mask layer blanket over the substrate 300, followed by patterning the mask layer into the patterned mask ML1 using suitable photolithography and etching techniques. The patterned mask ML1 includes silicon oxide, silicon nitride (Si$_3$N$_4$), the like, or combinations thereof.

Figure 19:
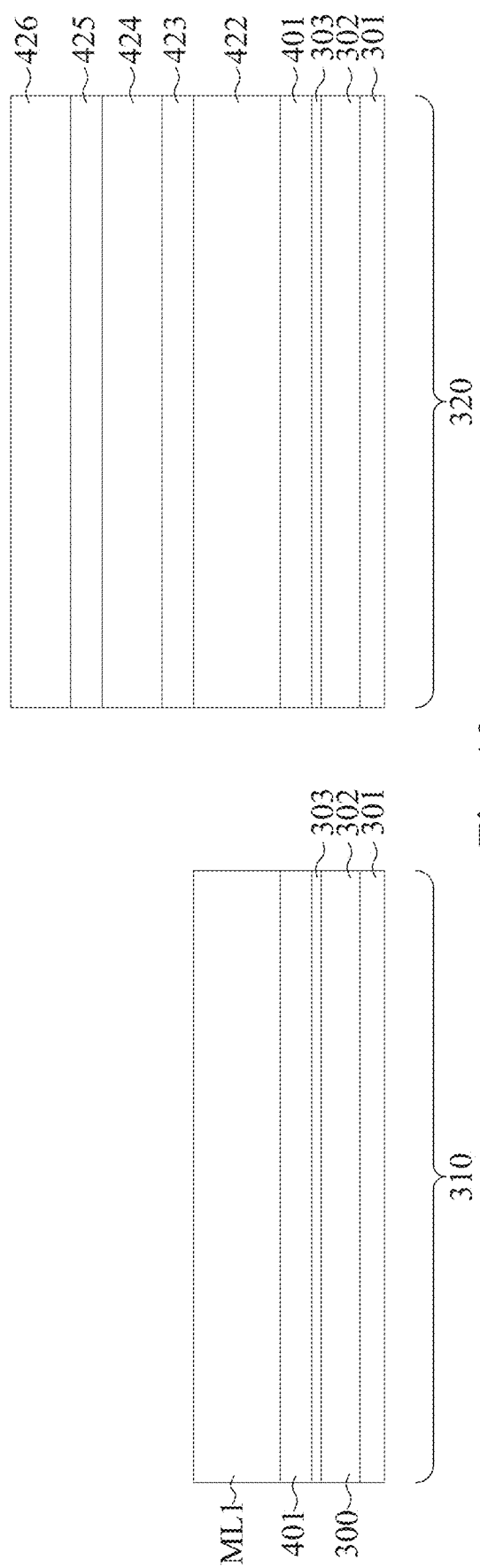

After the NFET region 310 is covered by the patterned mask ML1, a layer stack is formed over the PFET region 320, as illustrated in FIG. 19. A first semiconductor layer (first sacrificial layer) 422 is epitaxially grown on the PFET region 320, a second semiconductor layer (first channel layer) 423 is epitaxially grown on the first semiconductor layer 422, another first semiconductor layer (second sacrificial layer) 424 is epitaxially grown on the second semiconductor layer 423, another second semiconductor layer (second channel layer) 425 is epitaxially grown on the first semiconductor layer 424, and another first semiconductor layer (third sacrificial layer) 426 is epitaxially grown on the second semiconductor layer 425. The epitaxy processes include CVD deposition techniques (e.g., vapor-phase epitaxy (VPE) and/or ultra-high vacuum CVD (UHV-CVD)), molecular beam epitaxy (MBE), and/or other suitable processes.

In some embodiments, the first and second semiconductor layers are alternately stacked such that there are more than two layers each of the first and second semiconductor layers. In some embodiments, each of the second semiconductor layers, which become the nanosheets or channel layers, can be formed of a same material or different materials. The nanosheets can be interchangeably referred to as nanowires, nanoslabs and nanorings, depending on their geometry. In some embodiments, the first and second semiconductor layers are made of different materials selected from the group consisting of Si, Ge, SiGe, GeSn, Si/SiGe/Ge/GeSn, SiGeSn, and combinations thereof.

The lattice constant of the channel layers 423 and 425 is greater than the lattice constant of the sacrificial layers 422, 424 and 426, so that the channel layers 423 and 425 are under compressive strains once the epitaxy growth is complete, which in turn will increase hole mobility in the channel layers 423 and 425, thus improving the device performance of p-type GAA FETs formed in the PFET region 320. In this way, the compressive-strained channels can be realized without forming regrown source/drain stressors. Moreover, the strain in channels induced from the buffer layer 401 is retained after the whole device fabrication process (e.g., including a whole front-end-of-line (FEOL) process and a whole back-end-of-line (BEOL) process).

At this intermediate stage as illustrated in FIG. 19, the channel layers 423 and 425 are substantially un-doped to reduce impurity scattering and random dopant fluctuation, and the sacrificial layers 422, 424 and 426 are heavily doped with a p-type impurity (e.g., boron) that will be diffused into source/drain regions in the channel layers 423 and 425 in a subsequent step. The sacrificial layers 422, 424 and 426 are in-situ doped during epitaxially growth thereof.

In some specific embodiments for the p-type GAA FET, the sacrificial layers 422, 424 and 426 are heavily p-doped silicon layers (i.e., p⁺Si), and the channel layers 423 and 425 are substantially un-doped silicon germanium layer (i.e., un-doped SiGe). The heavily p-doped silicon sacrificial layers 422, 424 and 426 may have a p-type impurity concentration 4 orders, 5 orders, or even 9 orders higher than an n-type impurity concentration in the PFET region 320 in the topmost layer 303 of the SOI substrate 300. By way of example and not limitation, the boron concentration of the silicon sacrificial layers 422, 424 and 426 may be in a range from about $1\times10^{19}$ cm$^{-3}$ to about $1\times10^{23}$ cm$^{-3}$ (e.g., $2.7\times 10^{20}$ cm$^{-3}$), the phosphorous concentration in the PFET region 320 of the substrate 300 may be in a range from about $1\times10^{14}$ cm$^{-3}$ to about $1\times10^{20}$ cm (e.g., $1\times10^{15}$ cm$^{-3}$). In some other specific embodiments for the p-type GAA FET, the sacrificial layers 422, 424 and 426 are heavily p-doped germanium layers (i.e., p⁺ Ge), and the channel layers 423 and 425 are substantially un-doped germanium tin layer (i.e., un-doped GeSn).

Figure 20:
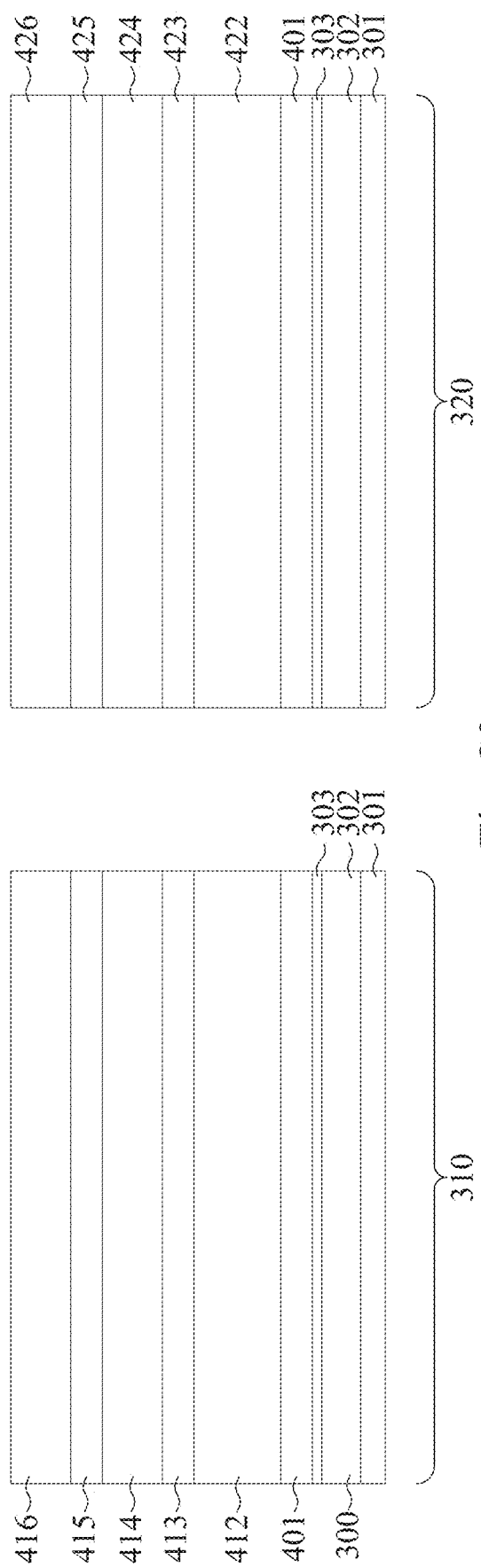

Once the epitaxial layer stack has been formed over the PFET region 320, the mask ML1 is removed. An epitaxial layer stack is then formed over the NFET region 310. The resultant structure is illustrated in FIG. 20. In some specific embodiments, a third semiconductor layer (first sacrificial layer) 412 is epitaxially grown on the strain-relaxed buffer layer 401 in the NFET region 310, a fourth semiconductor layer (first channel layer) 413 is epitaxially grown on the third semiconductor layer 412, another third semiconductor layer (second sacrificial layer) 414 is epitaxially grown on the fourth semiconductor layer 413, another fourth semiconductor layer (second channel layer) 415 is epitaxially grown on the third semiconductor layer 414, and another third semiconductor layer (third sacrificial layer) 416 is epitaxially grown on the fourth semiconductor layer 415. The epitaxy processes include CVD deposition techniques (e.g., vapor-phase epitaxy (VPE) and/or ultra-high vacuum CVD (UHV-CVD)), molecular beam epitaxy (MBE), and/or other suitable processes.

In some embodiments, the third and fourth semiconductor layers are alternately stacked such that there are more than two layers each of the third and fourth semiconductor layers. In some embodiments, each of the fourth semiconductor layers, which become the nanosheets or channel layers, can be formed of a same material or different materials.

In some embodiments, the third and fourth semiconductor layers are made of different materials selected from the group consisting of Si, Ge, SiGe, GeSn, Si/SiGe/Ge/GeSn, SiGeSn, and combinations thereof. In some embodiments, the SiGe is $Si_{1-x}Ge_x$, where $0.02 \leq x \leq 0.98$.

The lattice constant of the channel layers 413 and 415 is smaller than the lattice constant of the sacrificial layers 412, 414 and 416, so that the channel layers 413 and 415 are under tensile strains once the epitaxy growth is complete, which in turn will increase electron mobility in the channel layers 413 and 415, thus improving the device performance of n-type GAA FETs formed in the NFET region 310. In this way, the tensile-strained channels can be realized without forming regrown source/drain stressors. Moreover, the strain in channels induced from the buffer layer 401 is retained after the whole device fabrication process (e.g., including a whole FEOL process and a whole BEOL process).

At this intermediate stage as illustrated in FIG. 20, the channel layers 413 and 415 are substantially un-doped to reduce impurity scattering and random dopant fluctuation, and the sacrificial layers 412, 414 and 416 are heavily doped with a n-type impurity (e.g., phosphorous) that will be diffused into source/drain regions in the channel layers 413 and 415 in a subsequent step. The sacrificial layers 412, 414 and 416 are in-situ doped during epitaxially growth thereof.

In some specific embodiments for the n-type GAA FET, the sacrificial layers 412, 414 and 416 are heavily n-doped germanium layers (e.g., n⁺ Ge), and the channel layers 413 and 415 are substantially un-doped silicon germanium layer (e.g., un-doped $Si_{0.02}Ge_{0.98}$). In such embodiments, the channel layers 413 and 415 have a greater silicon atomic concentration than that of the sacrificial layers 412, 414 and 416. Therefore, the channel layers 413 and 415 have a greater tensile strain than that in the sacrificial layers 412, 414 and 416 and the buffer layer 401. For example, the germanium buffer layer 401, and the germanium sacrificial layers 412, 414 and 416 have a tensile strain value of about 0.10% to about 0.14% (e.g., about 0.12%) resulting from the annealing process AL1 as discussed previously with respect to FIG. 18, and the channel layers 413 and 415 have a greater tensile strain value of about 0.18% to about 0.22% (e.g. about 0.20%). The improved tensile strain in channel layers 413 and 415 result from the sacrificial layers 412, 414 and 414 as well as the buffer layer 401. In some other embodiments for the n-type GAA FET, the sacrificial layers 412, 414 and 416 are heavily n-doped silicon germanium layers (i.e., n+ SiGe), and the channel layers 413 and 415 are substantially un-doped silicon layer (i.e., un-doped Si).

The heavily n-doped sacrificial layers (e.g., n+ Ge layers) 412, 414 and 416 may have an n-type impurity concentration 4 orders, 5 orders, or even 9 orders higher than a p-type impurity concentration in the NFET region 310 in the SOI substrate's topmost layer 303. By way of example and not limitation, the phosphorous concentration of the sacrificial layers 412, 414 and 416 may be in a range from about $1\times10^{19}$ cm$^{-3}$ to about $1\times10^{23}$ cm$^{-3}$ (e.g., $2.7\times10^{20}$ cm$^{-3}$), and the boron concentration in the NFET region 310 in the SOI substrate's topmost layer 303 may be in a range from about $1\times10^{14}$ cm$^{-3}$ to about $1\times10^{20}$ cm (e.g., $1\times10^{15}$ cm$^{-3}$).

Figure 36:
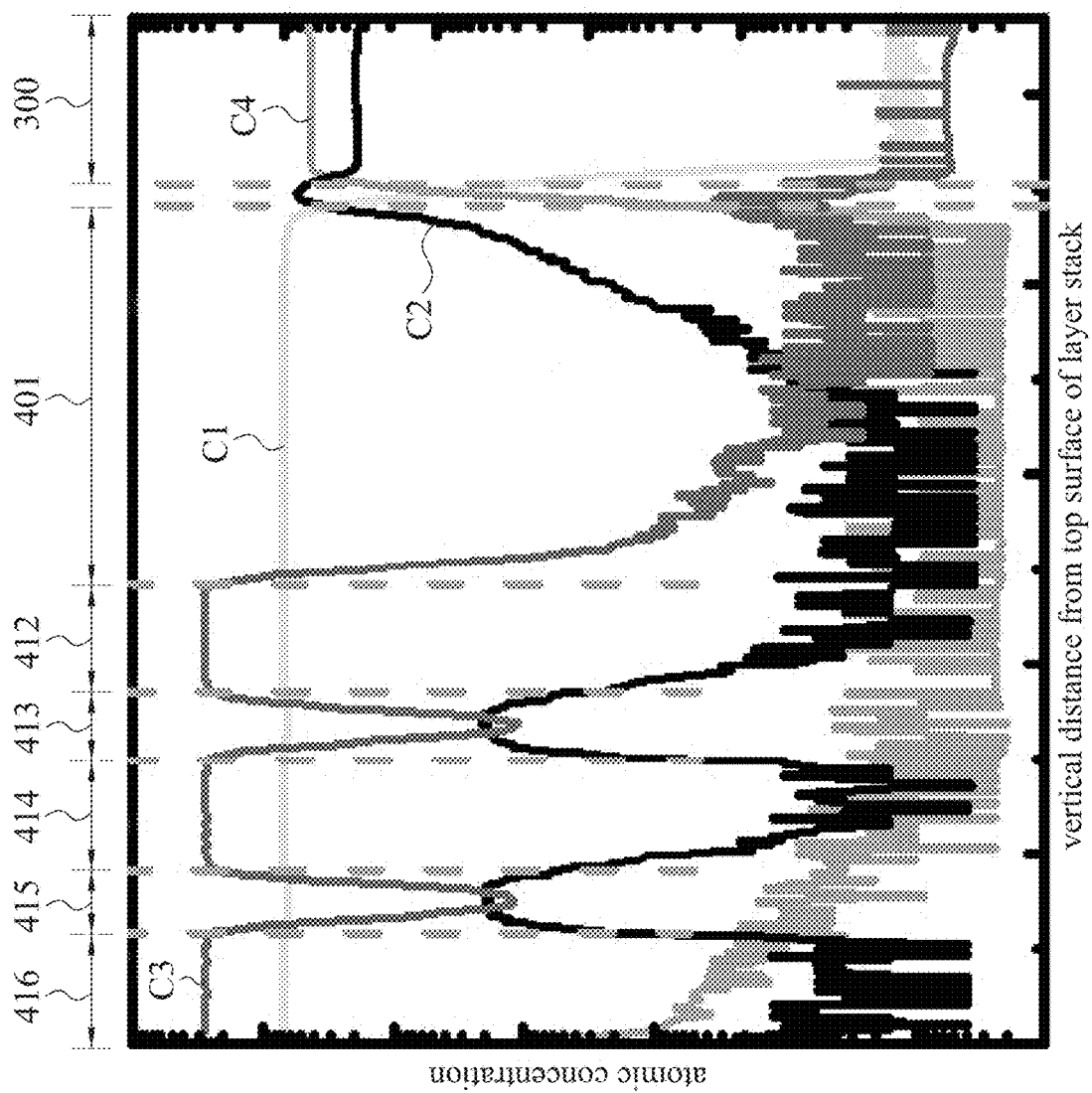
FIG. 36 is a graph illustrating an experimental result showing atomic concentrations of various chemical elements in the NFET region that is observed by Secondary Ion Mass Spectroscopy (SIMS) measurement.

FIG. 36 is a graph illustrating an experimental result showing atomic concentrations of various chemical elements in the NFET region 310 that is observed by Secondary Ion Mass Spectroscopy (SIMS) measurement after the layer stack is formed on the NFET region 310, wherein atomic concentration is shown on the vertical axis in FIG. 36, and the vertical distance from a top surface of the layer stack (i.e., top surface of the topmost sacrificial layer 416) is shown on the horizontal axis in FIG. 36. In this experiment, the sacrificial layers 412, 414 and 416 are germanium layers doped with phosphorous, and the channel layers 413 and 415 are substantially un-doped silicon germanium ($Si_{0.02}Ge_{0.98}$) layer. In FIG. 36, the curve C1 represents a germanium atomic concentration along a vertical distance from a top surface of the layer stack, the curve C2 represents a silicon atomic concentration along a vertical distance from a top surface of the layer stack, the curve C3 represents a phosphorous atomic concentration along a vertical distance from a top surface of the layer stack, and the curve C4 represents an oxygen atomic concentration along a vertical distance from a top surface of the layer stack.

As illustrated in the curve C3 in FIG. 36, the sacrificial layers 412, 414 and 416 have a greater phosphorous atomic concentration than that of the channel layer 413 and 415. This proves that the sacrificial layers 412, 414 and 416 are doped with phosphorous, and the channel layers 413 and 415 are substantially un-doped with phosphorous. It is noted that the channel layers 413 and 415 may still have non-zero values of phosphorous concentration due to unintentional phosphorous diffusion from the sacrificial layers 412, 414 and 416. Comparing the curve C3 with the curve C1, the phosphorous atomic concentration in the sacrificial layers 412, 414 and 416 is greater than the germanium atomic concentration in the sacrificial layers 412, 414 and 416. This proves that the sacrificial layers 412, 414 and 416 are heavily doped with phosphorous.

As illustrated in the curve C2 of FIG. 36, the channel layers 413 and 415 have a greater silicon atomic concentration than that of the sacrificial layers 412, 414 and 416. Moreover, the buffer layer 401 has gradient silicon germanium that increases as a distance from the substrate 300 decreases, because of unintentional silicon diffusion from the substrate 300.

Figure 21:
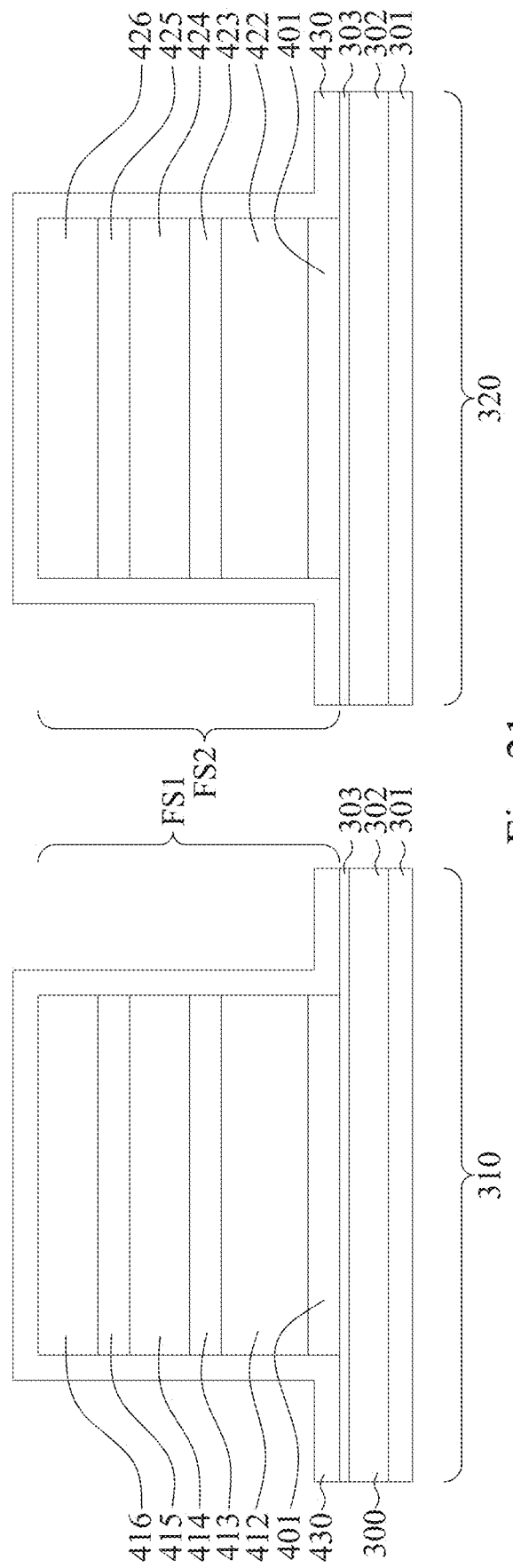

Reference is made back to FIG. 21. Once the layer stack on the NFET region 310 has been formed, a patterning process is performed on the layer stacks on the NFET region 310 and the PFET region 320 to form a fin structure FS1 on the NFET region 310 and a fin structure FS2 on the PFET region 320 by using suitable photolithography and etching techniques, as discussed previously with respect to FIGS. 3A and 3B. Once the fin structures FS1 and FS2 have been formed, a dielectric layer (e.g., silicon oxide ($SiO_2$) layer) 430 is conformally formed over the substrate 300 using suitable deposition techniques, such as CVD, ALD, thermal oxidation, the like or combinations thereof. The resultant structure is illustrated in FIG. 21.

Figure 22:
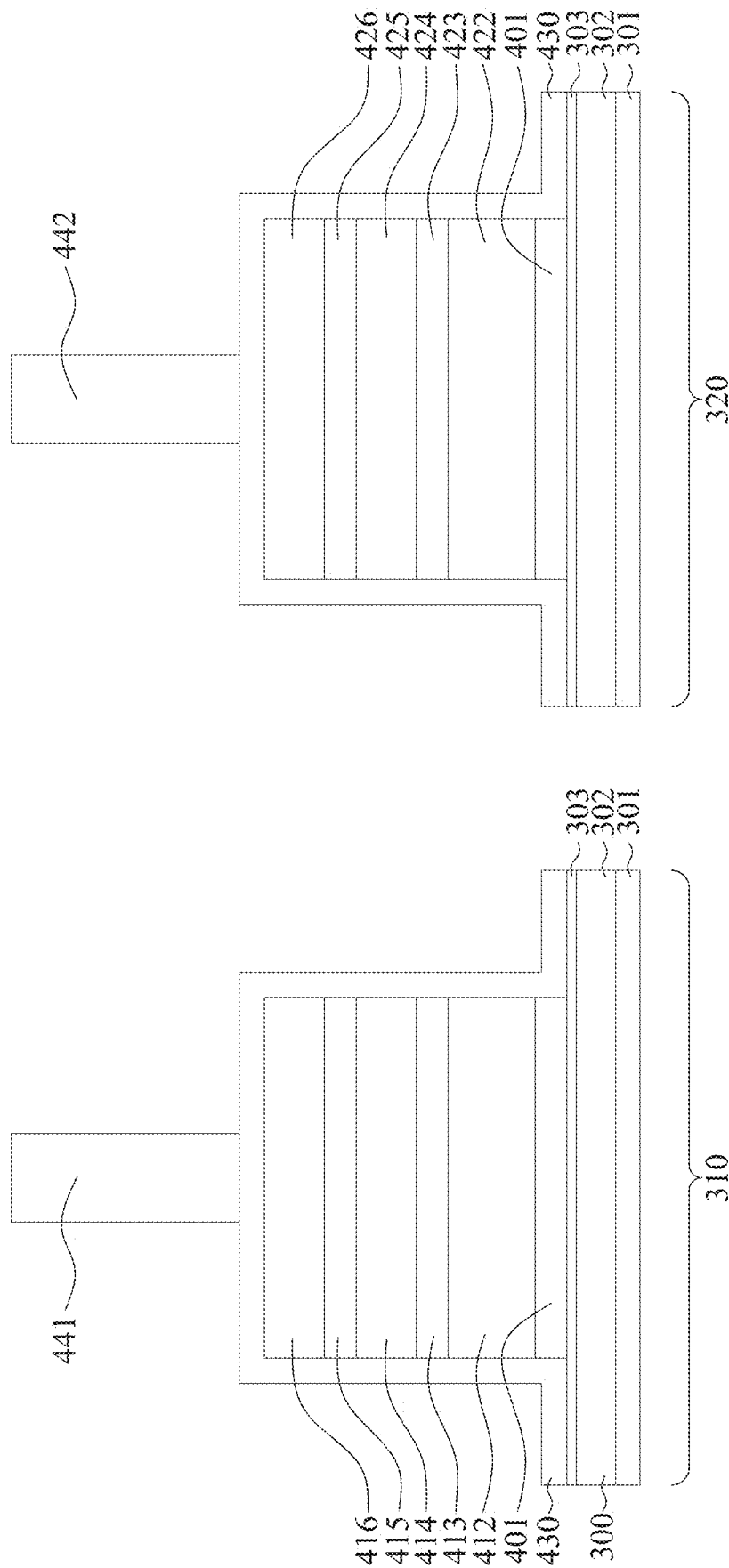

Once the dielectric layer 430 has been formed, dummy gate electrodes 441 and 442 are respectively formed across the fin structures FS1 and FS2, as illustrated in FIG. 22. The dummy gate electrodes 441 and 442 have a lengthwise direction perpendicular to the lengthwise direction of the fin structures FS1 and FS2. The dummy gate electrodes 441 and 442 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate electrodes 441 and 442 may be formed by, for example, depositing a polysilicon layer over the substrate 300, planarizing the deposited polysilicon layer by CMP, and then patterning the planarized polysilicon layer into the dummy gate electrodes 441 and 442 using suitable photolithography and etching techniques.

Figure 23:
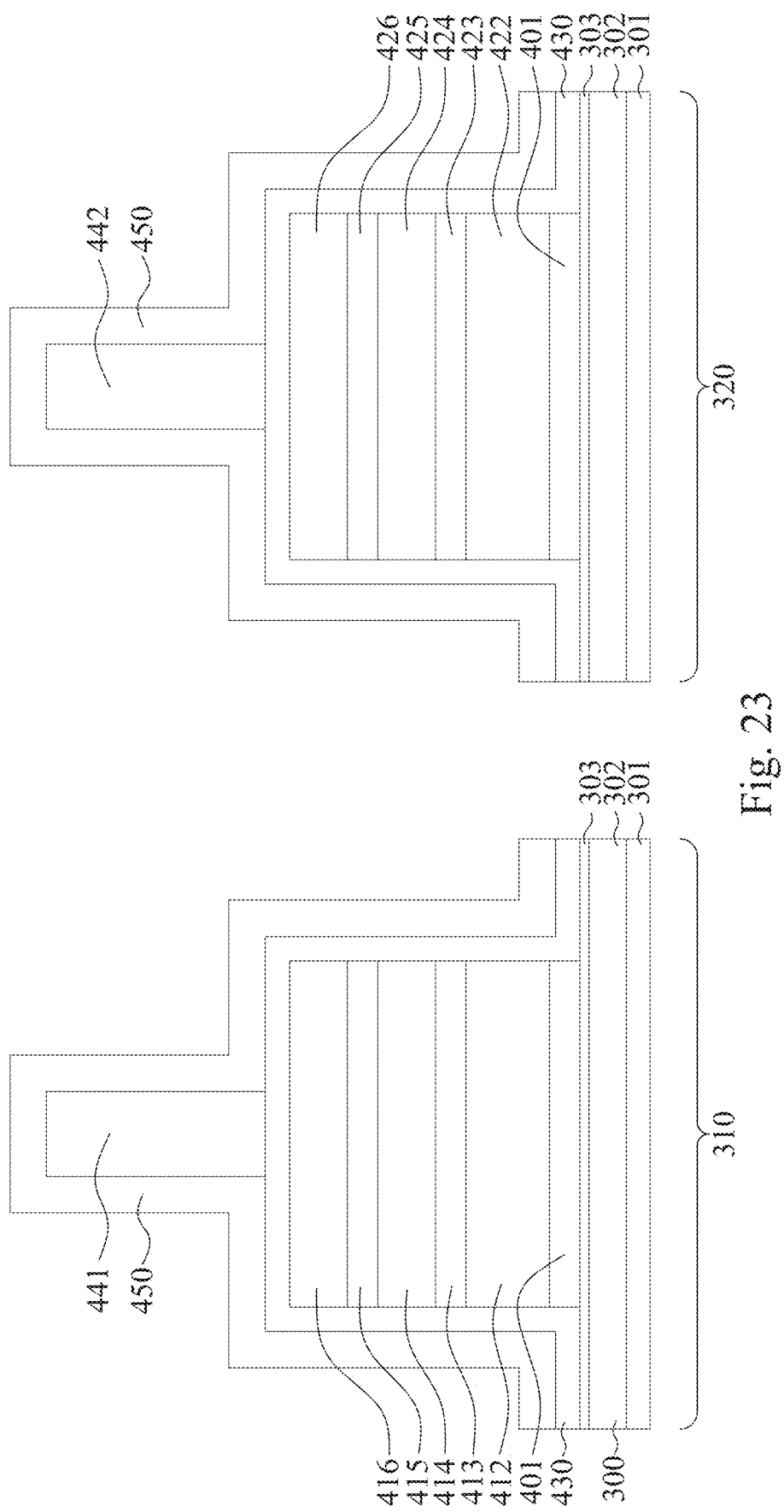

Once the dummy gate electrodes 441 and 442 have been formed, a spacer layer 450 is conformally formed over the substrate 300 using suitable deposition techniques, such as CVD, ALD, the like or combinations thereof. The resultant structure is illustrated in FIG. 23. The spacer layer 450 includes silicon nitride ($Si_3N_4$), although other materials, such as silicon oxynitride, silicon carbide, silicon carbonitride, silicon oxycarbonitride, silicon oxycarbide, porous dielectric materials, hydrogen doped silicon oxycarbide (SiOC:H), low-k dielectric materials, or other suitable dielectric materials, may be used.

Figure 24:
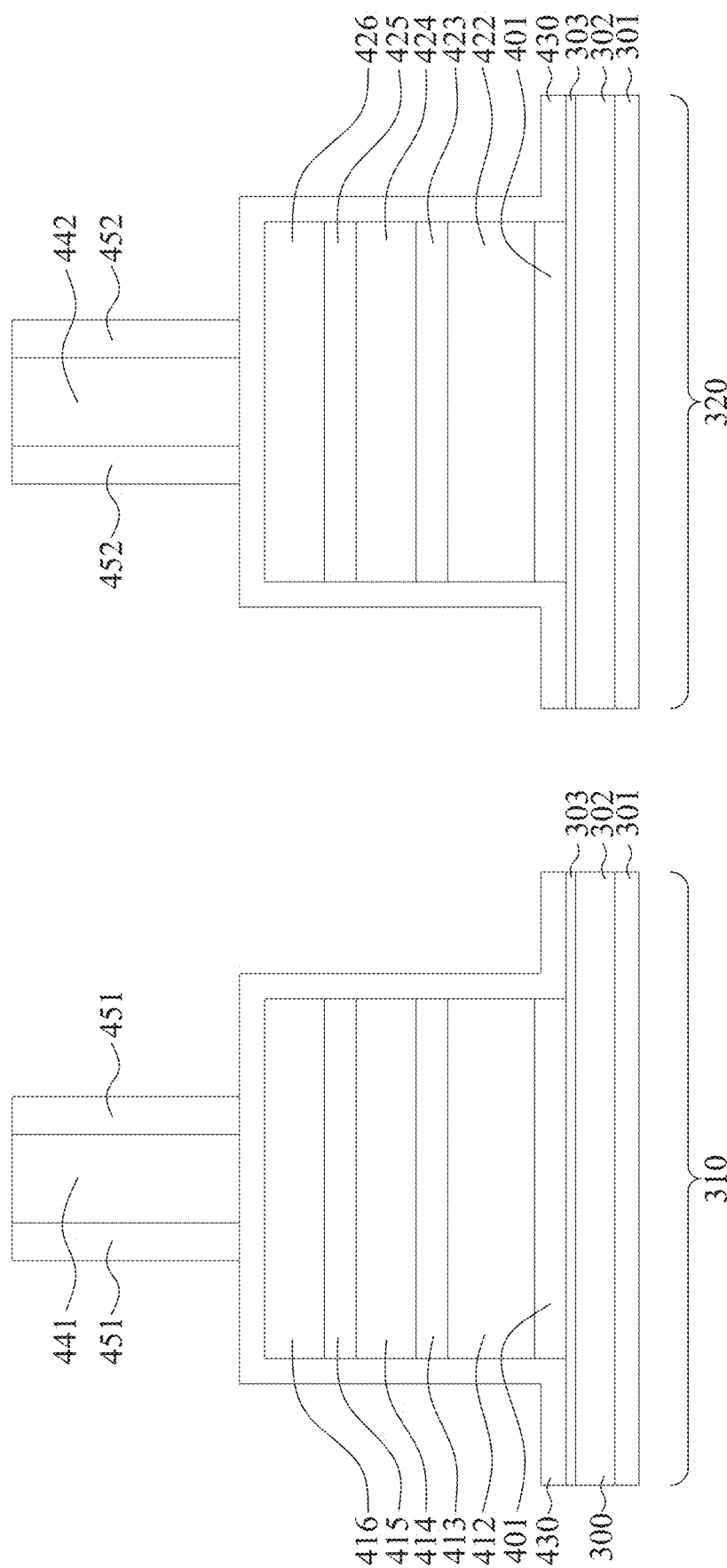

Next, an anisotropic etching process is performed to etch on the spacer layer 450, so that horizontal portions of the spacer layer 450 are removed while leaving portions 451 and 452 of the spacer layer 450 on sidewalls of the dummy gate electrode 441 and 442. The resulting structure is illustrated in FIG. 24. The remaining spacer portions 451 on sidewalls of the dummy gate electrode 441 can be interchangeably referred to gate spacers 451, and remaining spacer portions 452 on sidewalls of the dummy gate electrode 442 can be interchangeably referred to gate spacers 452. In some specific embodiments, the anisotropic etching is an RIE process using a plasma produced from $CHF_3$ gas and/or $Cl_2$ gas.

Once the spacers 451 and 452 have been formed, as illustrated in FIG. 25, a patterned mask ML2 is formed over the PFET region 320 while leaving the NFET region 310 exposed. The patterned mask ML2 may be formed using depositing a mask layer blanket over the substrate 300, followed by patterning the mask layer into the patterned mask ML2 using suitable photolithography and etching techniques. The patterned mask ML2 includes silicon nitride ($Si_3N_4$), silicon oxynitride, the like, or combinations thereof.

Once the patterned mask ML2 has been formed, the dummy gate electrode 441 in the NFET region 310 is removed to form a gate trench GT between the gate spacers 451, by using a selective etching process that etches the dummy gate structure 441 at a faster etch rate than it etches other materials on the substrate 300. For example, the selective etching is an isotropic wet etching process using potassium hydroxide (KOH) or tetramethylammonium hydroxide (TMAH) as an etchant. Afterwards, a portion of the dielectric layer 430 in the gate trench GT is removed using a selective etching process that etches the material of the dielectric layer 430 (e.g., silicon oxide) faster than other materials on the substrate 300. In some embodiments, other portions of the dielectric layer 430 in the NFET region 310 except for the gate trench GT between the gate spacers 451 are covered by a photoresist mask (not shown) formed using suitable photolithography techniques, so that the dielectric layer 430 can remain on the NFET region 310 except for the region between the gate spacers 451. Once the portion of the dielectric layer 430 between the gate spacers 451 have been removed, the photoresist mask can be removed, for example, in an ashing step, such as using oxygen plasma.

Thereafter, the n-doped sacrificial layers 412, 414 and 416 and the buffer layer 401 in the gate trench GT are removed by a selective etching process, thus forming openings among the channel layers 413, 415 and the substrate 300. In this way, channel regions $413_{CH}$, and $415_{CH}$ of the channel layers 413 and 415 become suspended over the substrate 300. Details of the selective etching process (interchangeably referred to as channel release process) have been discussed previously with respect to FIGS. 12A and 12B and are thus not repeated for the sake of brevity.

Once the channel release process is complete, a high-k/metal gate structure 460 is formed within the openings provided by the release of nanosheets 413 and 415. The resulting structure is illustrated in FIG. 25. In various embodiments, the high-k/metal gate structure 460 includes a gate dielectric layer 461 formed around the nanosheets 413 and 415, an n-type work function metal (also referred to as N-metal) layer 462 formed over the gate dielectric layer 461, and a fill metal 463 formed over the work function metal layer 461. The gate dielectric layer 461 includes an interfacial layer and a high-k dielectric layer formed over the interfacial layer. Detailed materials and fabrication of the interfacial layer, the high-k dielectric layer and the fill metal 463 have been discussed previously with respect to FIGS. 13A and 13B and are thus not repeated for the sake of brevity. The n-type work function metal layer 462 may exemplarily include, but are not limited to, titanium aluminide (TiAl), titanium aluminium nitride (TiAlN), carbonitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials.

Next, a top portion of the fill metal 463 over the fin structure FS1 is patterned into a metal pad 463P by using a selective etching process that etches the fill metal 463 at a faster rate than etching the n-type work function metal layer 462. The resulting structure is illustrated in FIG. 26. In some embodiments, the metal pad 463P has a sidewall aligned with a vertical interface between the gate dielectric layer 461 and the sacrificial layer 416.

Figure 27:
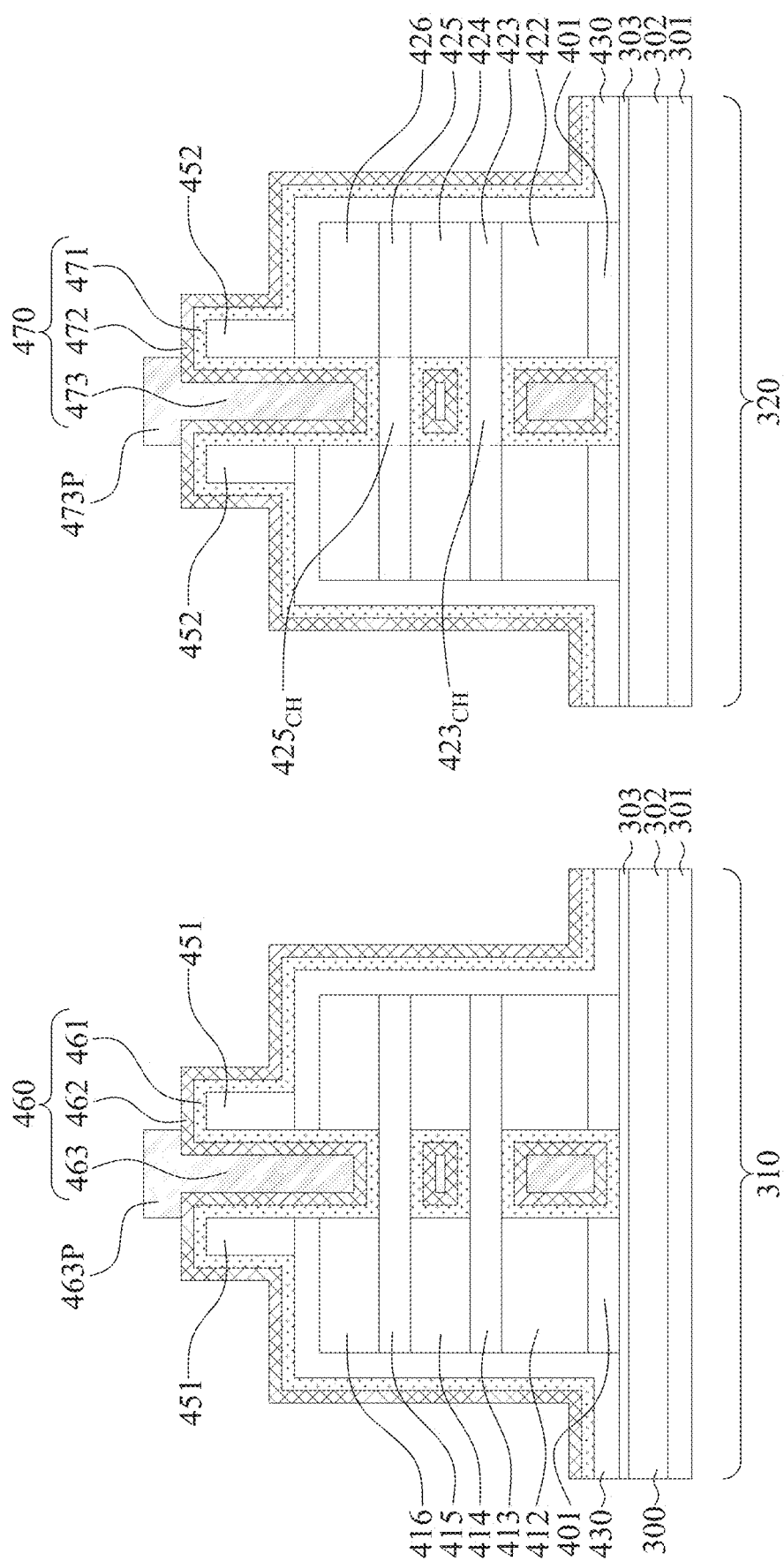

Afterwards, the mask layer ML2 is removed from the PFET region 320, and then the process steps similar to that illustrated in FIGS. 25 and 26 are performed on the PFET region 320 to form a high-k/metal gate structure 470 wrapping around each nanosheets 423 and 425. The resulting structure is illustrated in FIG. 27. For example, the process steps include, removing the dummy gate electrode 442 to form a gate trench between the gate spacers, removing a portion of the dielectric layer 430 in the gate trench, releasing the channel regions $423_{CH}$ and $425_{CH}$ of the nanosheets 423 and 425 by selective etching the sacrificial layers 422, 424 and 426, and the buffer layer 401 that are exposed by the gate trench, forming a high-k/metal gate structure 470 including a gate dielectric layer 471, a p-type work function metal layer 472 and a fill metal 473 in the openings provided by the release of nanosheets 413 and 415, and then patterning a top portion of the fill metal 473 into a metal pad 473P.

The gate dielectric layer 471 includes an interfacial layer and a high-k dielectric layer formed over the interfacial layer. Detailed materials and fabrication of the interfacial layer, the high-k dielectric layer and the fill metal 473 have been discussed previously with respect to FIGS. 13A and 13B and are thus not repeated for the sake of brevity. The p-type work function metal layer 472 may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

Next, an annealing process AL2 is performed to diffuse the n-type impurity (e.g., phosphorous) from the heavily doped sacrificial layers 412, 414, 416 into source/drain regions $413_{SD}$ and $415_{SD}$ of the nanosheets 413 and 415, and to diffuse the p-type impurity (e.g., boron) from the heavily doped sacrificial layers 422, 424, 426 into source/drain regions $423_{SD}$ and $425_{SD}$ of the nanosheets 423 and 425. The annealing process AL2 may be, for example, a rapid thermal anneal (RTA) or the like. The sacrificial layers 412', 414', and 416' after the annealing process AL2 have a lower n-type impurity concentration that the sacrificial layers 412, 414, and 416 before the annealing process AL2. Similarly, the sacrificial layers 422', 424', and 426' after the annealing process AL2 have a lower p-type impurity concentration that the sacrificial layers 412, 414, and 416 before the annealing process AL2.

Because the sacrificial layers 412', 414', and 416' and the source/drain regions $413_{SD}$ and $415_{SD}$ of the resulting nanosheets 413' and 415' are n-doped, they can be in combination referred to as source/drain regions of an n-type GAA FET. As a result, the sacrificial layers 412', 414', and 416' can be referred to as n-type source/drain layers. Similarly, because the sacrificial layers 422', 424', and 426' and the source/drain regions $423_{SD}$ and $425_{SD}$ of the resulting nanosheets 423' and 425' are p-doped, they can be in combination referred to as source/drain regions of an p-type GAA FET. As a result, the sacrificial layers 422', 424', and 426' can be referred to as p-type source/drain layers.

Because the channel regions $413_{CH}$ and $415_{CH}$ of the nanosheets 413 and 415 are surrounded by the gate structure 460 and thus spaced apart from the heavily doped layers 412, 414 and 416, and the channel regions $423_{CH}$ and $425_{CH}$ of the nanosheets 423 and 425 are surrounded by the gate structure 470 and thus spaced from the heavily doped layers 422, 424 and 426, the source/drain regions $413_{SD}$ and $415_{SD}$ of the nanosheets 413' and 415' have a greater n-type impurity concentration than that of the channel regions $413_{CH}$ and $415_{CH}$ of the nanosheets 413' and 415', and the source/drain regions $423_{SD}$ and $425_{SD}$ of the resulting nanosheets 423' and 425' have a greater p-type impurity concentration than that of the channel regions $423_{CH}$ and $425_{CH}$ of the nanosheets 423' and 425'.

Figure 29:
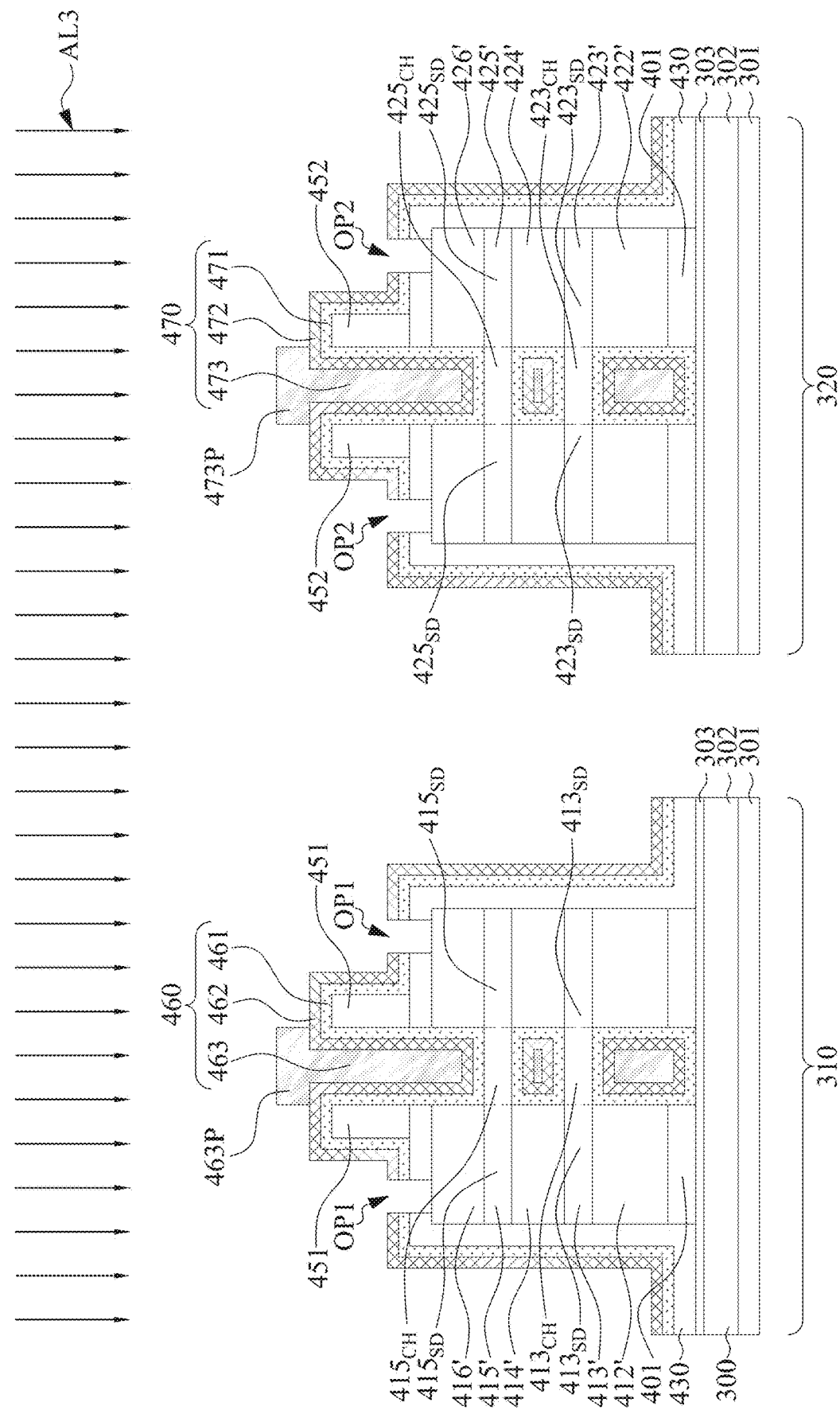

Next, as illustrated in FIG. 29, source/drain contact openings OP1 are formed through the n-type work function metal layer 462, the gate dielectric layer 461, and the dielectric layer 430 to the source/drain regions of the n-type GAA FET (e.g., to the n-type source/drain layer 416'), and source/drain contact openings OP2 are formed through the p-type work function metal layer 472, the gate dielectric layer 471, and the dielectric layer 430 to the source/drain regions of the p-type GAA FET (e.g., to the p-type source/drain layer 426'). The source/drain contact openings OP1 and OP2 are formed using suitable photolithography and etching techniques.

Afterwards, an annealing process AL3 is performed to activate the n-type impurities in the sacrificial layers 412', 414', and 416' and the source/drain regions $413_{SD}$ and $415_{SD}$ of the resulting nanosheets 413' and 415', and to activate the p-type impurities in the sacrificial layers 422', 424', and 426' and the source/drain regions $423_{SD}$ and $425_{SD}$ of the resulting nanosheets 423' and 425'. In some specific embodiments, the annealing process AL3 includes irradiating the source/drain regions of the n-type GAA FET and p-type GAA FET with radiation from a radiation source. In some embodiments, the radiation source is a laser or a flash lamp, including argon and xenon flash lamps. The layer stacks are exposed to the radiation for a period of time ranging from greater than 0 s to about 90 ms. In particular, regions of the layer stacks exposed by the source/drain contact openings OP1 and OP2 are exposed for a period of time ranging from greater than 0 s to about 90 ms, such as about 2 ns to about 0.8 ms. During the exposure to radiation, the exposed portions of the layer stacks undergo ultra-rapid heating and reach temperatures of up to 1800° C. In some other embodiments, the exposed portions of the layer stacks reach temperatures up to 1050° C. Channel regions $413_{CH}$ and $415_{CH}$ covered by the gate structure 460 and channel regions $423_{CH}$ and 425 CH covered by the gate structure 470 are not substantially heated because the metal pads 463P and the metal pads 473P reflects the radiation.

In some embodiments, the power density of the radiation is about 2 mJ/cm$^2$ to about 850 mJ/cm$^2$. In some embodiments, the radiation is laser radiation from a laser. In some embodiments, the wavelength of the laser radiation ranges from about 170 nm to about 2200 nm. In other embodiments, the wavelength used in the irradiation by the laser is about 198 nm to about 1880 nm (k=1878 nm is equivalent to the bandgap of Ge). In certain embodiments, a laser beam having a wavelength of about 532 nm is used. In some embodiments, the power density used in laser annealing is about 2 mJ/cm$^2$ to about 850 mJ/cm$^2$. In certain embodiments, the power density of the radiation ranges from about 260 mJ/cm$^2$ to about 290 mJ/cm$^2$. In certain embodiments, dynamic surface annealing occurs during the exposure to radiation. In dynamic surface annealing, the activation of the doped source/drain regions occurs without diffusion of the dopants. Therefore, the channel regions $413_{CH}$ and $415_{CH}$ of the nanosheets 413 and 415, and the channel regions $423_{CH}$ and $425_{CH}$ of the nanosheets 423 and 425 remain substantially un-doped after the annealing process AL3. In some embodiments, the full-width-at-half-maximum (FWHM) of the laser pulse is about 2 ns to about 0.5 ms. A particular spot on the layer stacks is exposed to the laser beam from about 15 ns to about 95 µs in some embodiments. The shape of laser beam can be any shape including linear, elliptical, circular, etc.

In certain embodiments, the laser radiation has a wavelength in a range from about 530 nm to about 550 nm, and the fluence of the laser radiation ranges from about 15 to about 75 mJ/cm$^2$. Because the metal pads 463P and 473P blocks and/or reflects the laser radiation, the source/drain regions of the layer stack are selectively irradiated with the laser radiation. The irradiation can be performed in ambient air, clean dry air, N$_2$, N$_2$+H$_2$, H$_2$, or inert gas (e.g.—He, Ne, and Ar).

Figure 30:
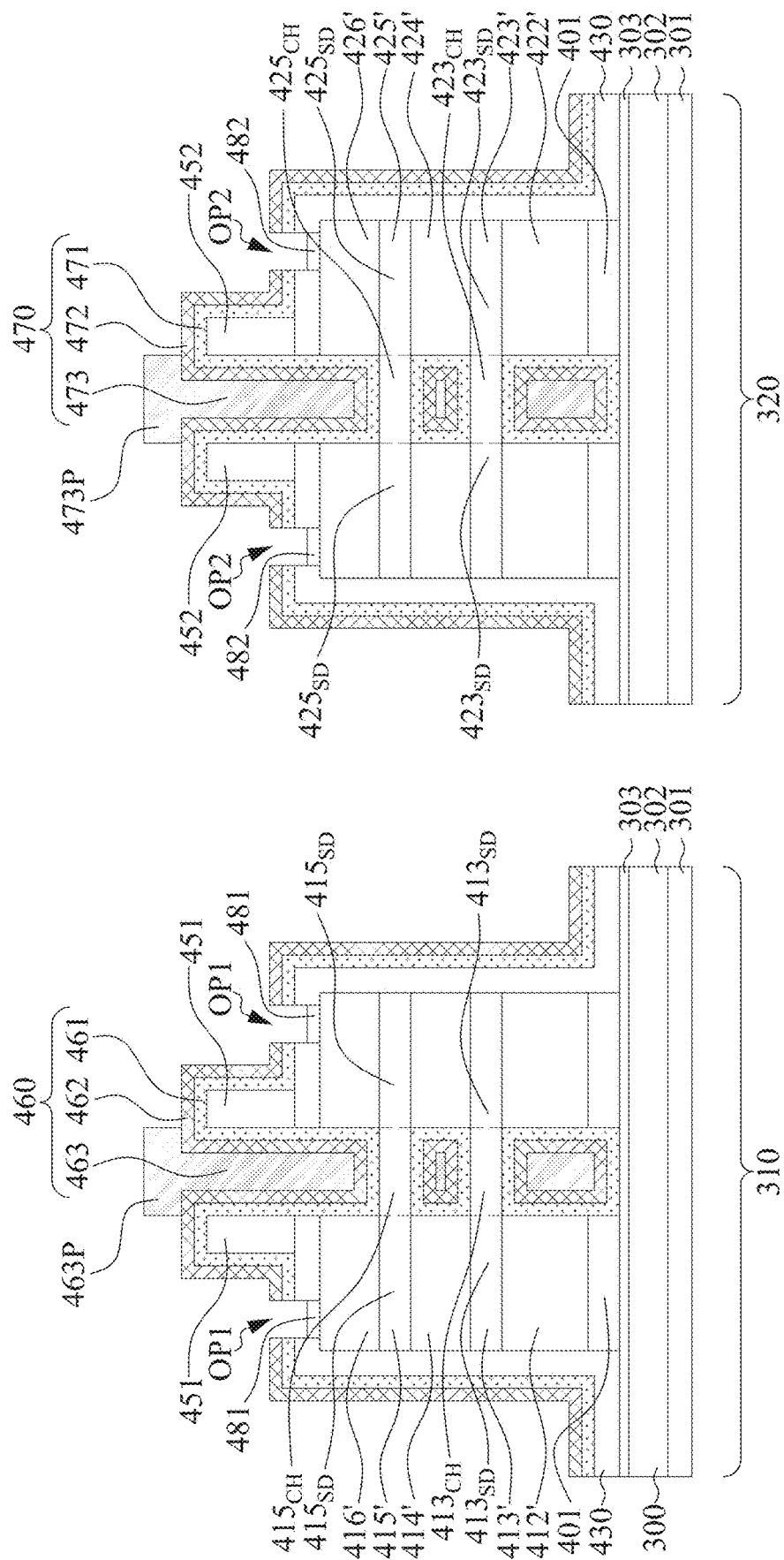

Afterwards, source/drain contacts 481 and 482 are formed in the openings OP1 and OP2 respectively by using, for example, a lift-off process. The resulting structure is illustrated in FIG. 30. By way of example and not limitation, the lift-off process includes coating photoresist on the substrate 300, patterning the photoresist to expose the openings OP1 and OP2, sputtering metal materials (e.g., copper, tungsten, nickel, cobalt, gold or other suitable metals) of the contacts 481 and 482 onto bottom surfaces of the openings OP1 and OP2, and then removing the photoresist by an ashing process.

Figure 31:
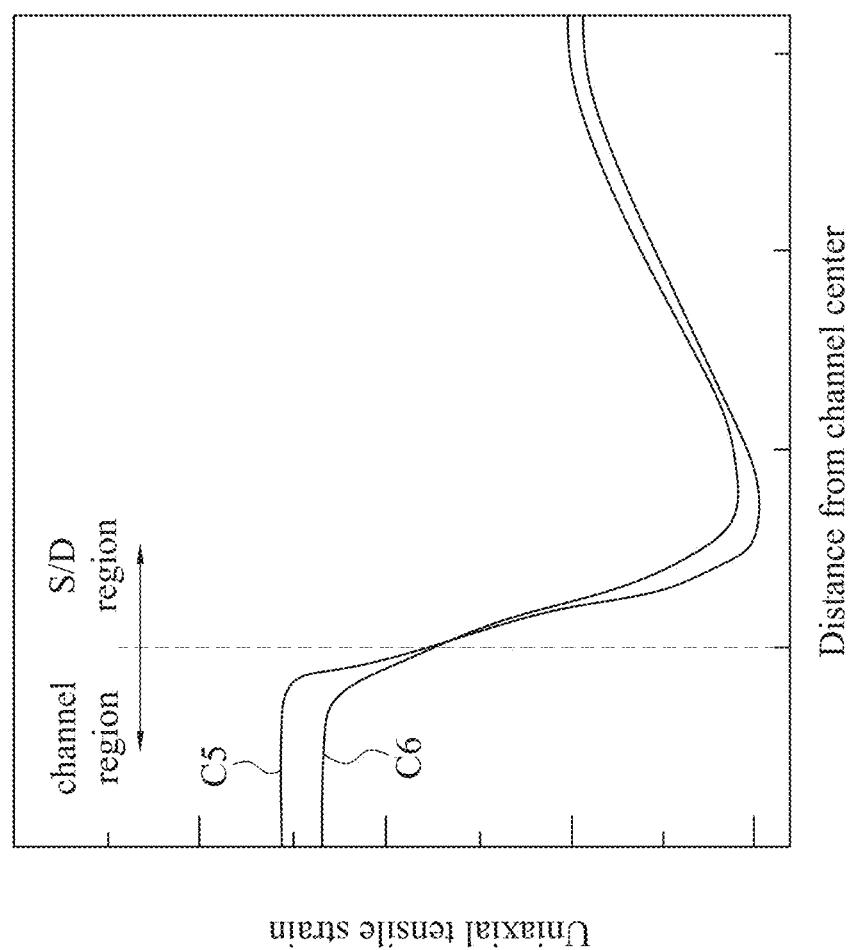
FIG. 31 is a graph illustrating a simulation result showing uniaxial tensile strain in the nanosheets in the NFET region after the channel release process is performed, according to some embodiments of the present disclosure.

FIG. 31 is a graph illustrating a simulation result showing uniaxial tensile strain in the nanosheets 413 and 415 in the NFET region 310 after the channel release process is performed, wherein the uniaxial tensile strain is shown on the vertical axis in FIG. 31, and the lateral distance from centers of channel regions (e.g., center of channel region $415_{CH}$ or $413_{CH}$) is shown on the horizontal axis in FIG. 31. In FIG. 31, the curve C5 represents uniaxial tensile strain in the upper nanosheet 415, and the curve C6 represents uniaxial tensile strain in the lower nanosheet 413. The curve C5 shows that the channel region $415_{CH}$ of the nanosheet 415 has a greater tensile strain than the source/drain region $415_{SD}$ of the nanosheet 415, and curve C6 shows that the channel region $413_{CH}$ of the nanosheet 413 has a greater tensile strain than the source/drain region $413_{SD}$ of the nanosheet 413. Moreover, comparing the curve C5 with the curve C6, the channel region $415_{CH}$ of the upper nanosheet 415 has a greater tensile strain than the channel region $413_{CH}$ of the lower nanosheet 413. In some embodiments, the channel region $415_{CH}$ of the nanosheet 415 and channel region $413_{CH}$ of the nanosheet 413 have a tensile strain in a range from about 0.24% to about 0.65% (e.g., about 0.27%).

Figure 32:
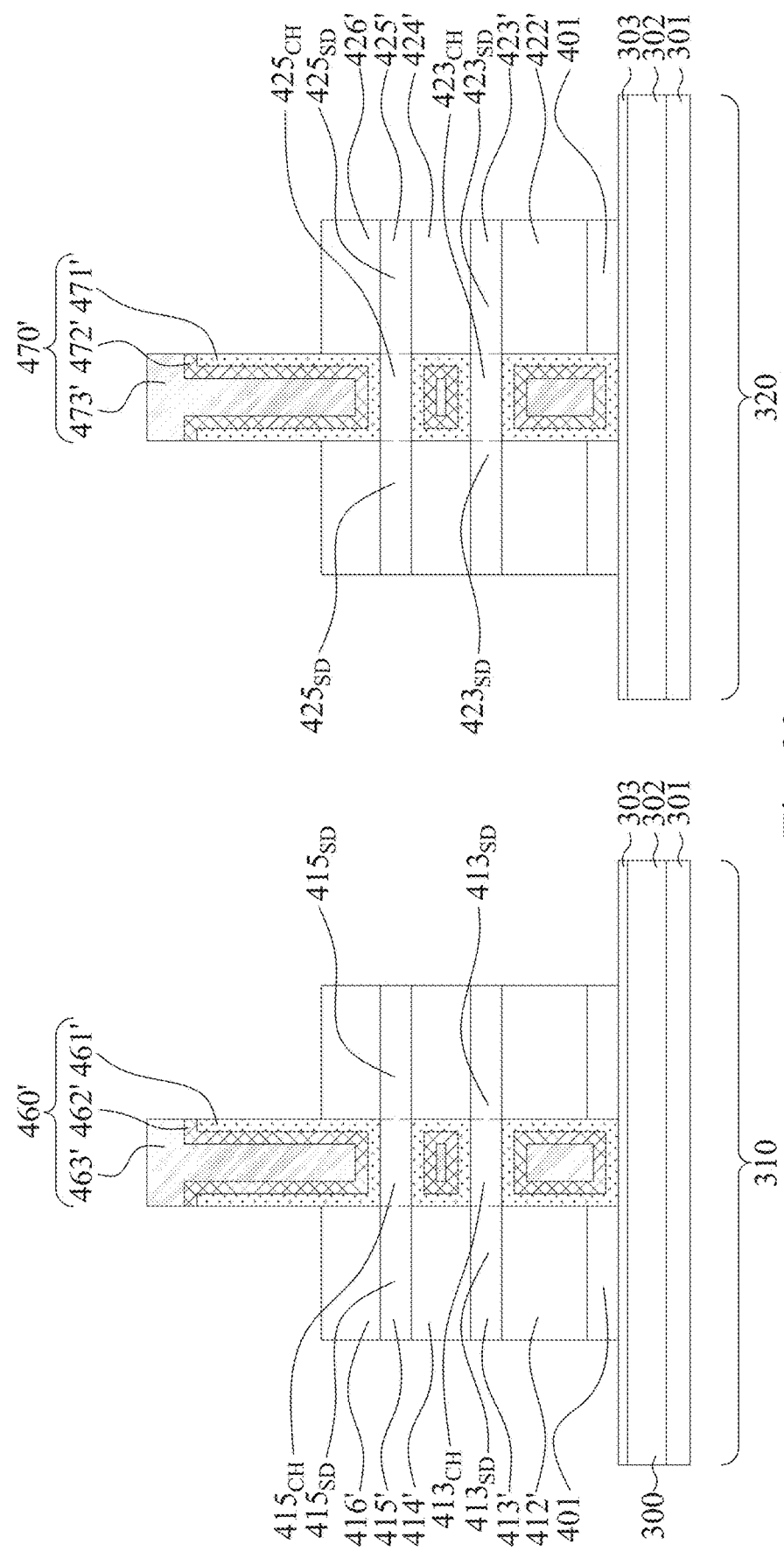
FIGS. 32-34 show exemplary sequential processes for manufacturing a GAA FET according to some embodiments of the present disclosure.
Figure 33:
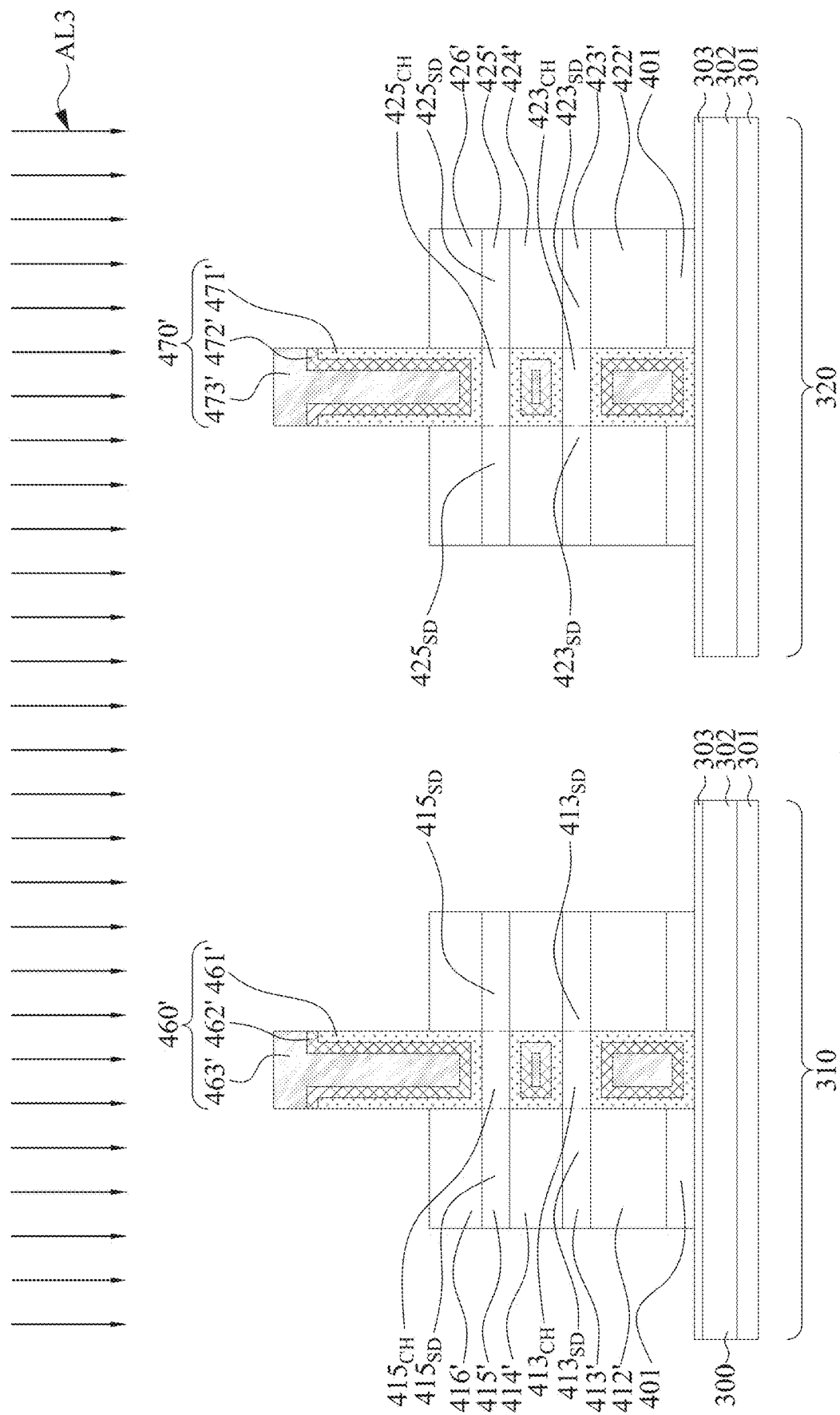
Figure 34:
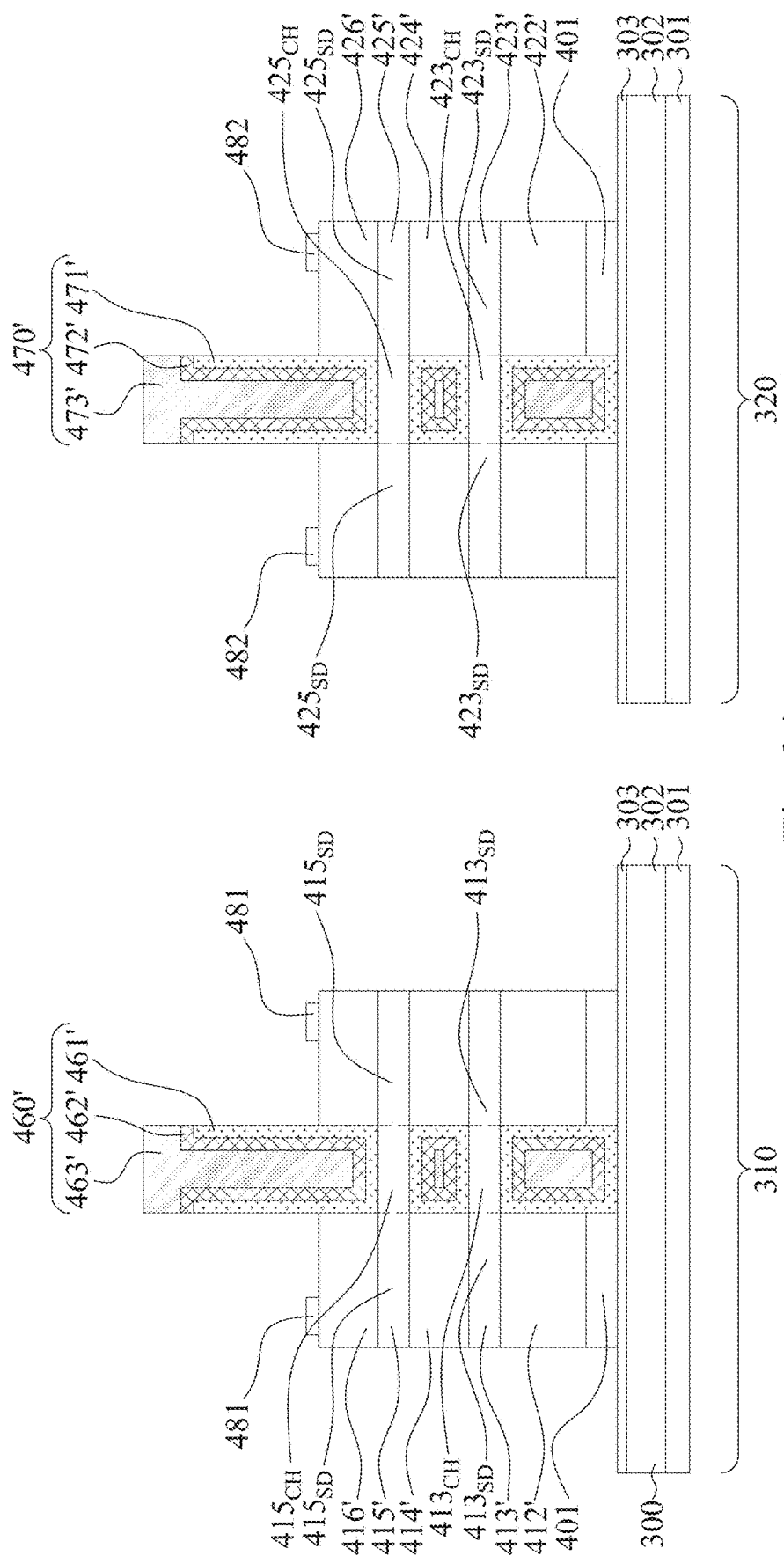

FIGS. 32-34 show exemplary sequential processes for manufacturing a GAA FET according to some embodiments of the present disclosure. It is understood that additional operations can be provided before, during, and after processes shown by FIGS. 32-34, and some of the operations described below can be replaced or eliminated, for additional embodiments of the method. The order of the operations/processes may be interchangeable. FIGS. 32-34 illustrate a cross-sectional view along Y-direction corresponding to the line A-A illustrated in FIG. 1.

Figure 28:
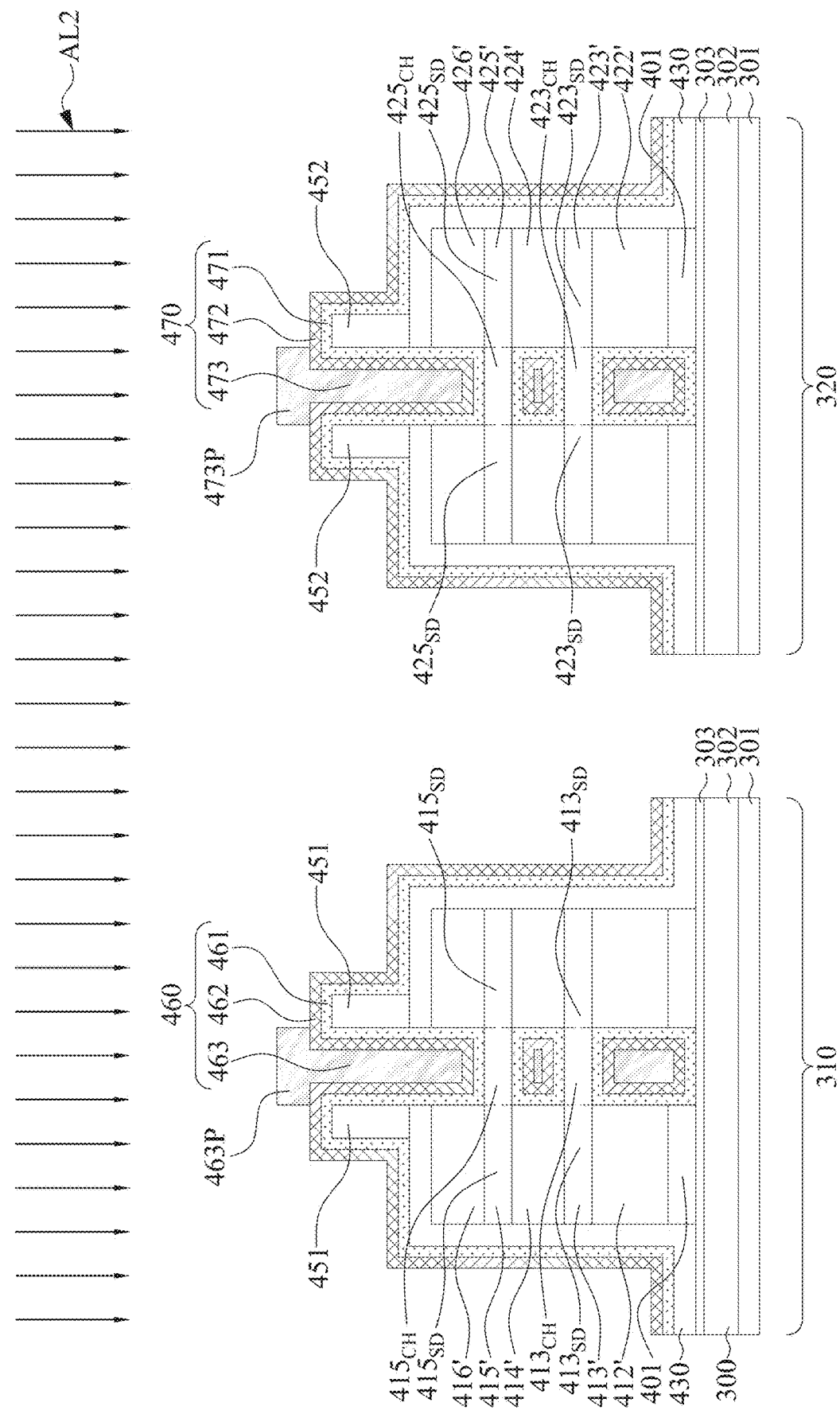

FIG. 32 illustrates a patterning process performed on the gate structures 460, 470 and the dielectric layer 430, after the annealing process AL2 as shown in FIG. 28 is performed. The patterning process is performed using suitable photolithography and etching techniques. The patterned gate structure 460', including the patterned gate dielectric layer 461', the patterned n-type work function metal layer 462' and the patterned fill metal 463', non-overlaps with the top surface of the n-type source/drain layer 416'. The resulting gate structure 470', including the patterned gate dielectric layer 471', the patterned p-type work function metal layer 472' and the patterned fill metal 473', non-overlaps with the top surface of the p-type source/drain layer 426'.

Next, as illustrated in FIG. 33, the annealing process AL3 is performed to activate the activate the n-type impurities in the sacrificial layers 412', 414', and 416' and the source/drain regions $413_{SD}$ and $415_{SD}$ of the resulting nanosheets 413' and 415', and to activate the p-type impurities in the sacrificial layers 422', 424', and 426' and the source/drain regions $423_{SD}$ and $425_{SD}$ of the resulting nanosheets 423' and 425', as discussed previously with respect to FIG. 29.

Afterwards, as illustrated in FIG. 34, source/drain contacts 481 and 482 are respectively formed on the n-type source/drain layer 416' and the p-type source/drain layer 426' by using, for example, a lift-off process as discussed previously with respect to FIG. 30.

Figure 35:
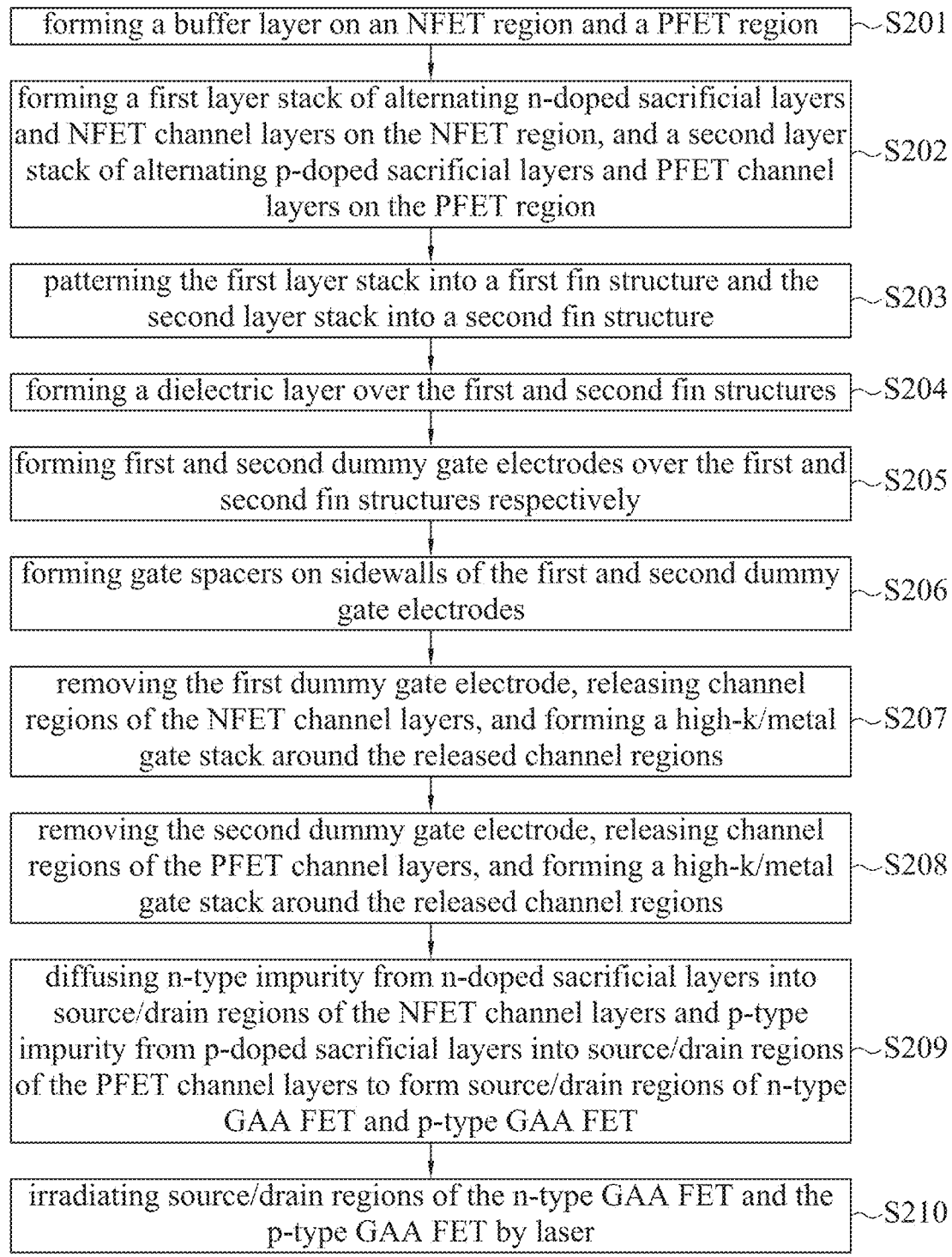
FIG. 35 is a flow chart illustrating a method of forming a GAA FET in accordance with some embodiments.

FIG. 35 illustrates a method M2 of forming a GAA FET in accordance with some embodiments. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S201, a buffer layer is formed on an NFET region and a PFET region. FIGS. 17 and 18 illustrate a cross-sectional view of some embodiments corresponding to acts in block S201.

At block S202, a first layer stack of alternating n-doped sacrificial layers and NFET channel layers is formed on the NFET region, and a second layer stack of alternating p-doped sacrificial layers and PFET channel layers is formed on the PFET region. FIGS. 19 and 20 illustrate a cross-sectional view of some embodiments corresponding to acts in block S202.

At block S203, the first layer stack is patterned into a first fin structure and the second layer stack is patterned into a second fin structure. At block S204, a dielectric layer is formed over the first and second fin structure. FIG. 21 illustrates a cross-sectional view of some embodiments corresponding to acts in blocks S203 and S204.

At block S205, first and second dummy gate electrodes are formed over the first and second fin structures respectively. FIG. 22 illustrates a cross-sectional view of some embodiments corresponding to act in block S205.

At block S206, gate spacers are formed on sidewalls of the first and second dummy gate electrodes. FIGS. 23 and 24 illustrate a cross-sectional view of some embodiments corresponding to act in block S206.

At block S207, the first dummy gate electrode is removed, channel regions of the NFET channel layers are released, and a high-k/metal gate stack is formed around the released channel regions. FIGS. 25 and 26 illustrate a cross-sectional view of some embodiments corresponding to act in block S207.

At block S208, the second dummy gate electrode is removed, channel regions of the PFET channel layers are released, and a high-k/metal gate stack is formed around the released channel regions. FIG. 27 illustrates a cross-sectional view of some embodiments corresponding to act in block S208.

At block S209, n-type impurity is diffused from n-doped sacrificial layers into source/drain regions of the NFET channel layers and p-type impurity is diffused from p-doped sacrificial layers into source/drain regions of the PFET channel layers to form source/drain regions of n-type GAA FET and p-type GAA FET. FIG. 28 illustrates a cross-sectional view of some embodiments corresponding to act in block S209.

At block S210, source/drain regions of the n-type GAA FET and the p-type GAA FET are irradiated by laser. FIG. 29 illustrates a cross-sectional view of some embodiments corresponding to act in block S210.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage of some embodiments is that atomic ratio (e.g., germanium-to-silicon atomic ratio) difference among the regrown source/drain layers in source/drain stressors can be tuned to reduce the strain mismatch among the semiconductor nanosheets. Another advantage of some embodiments is that the strained channels can be realized by a layer stack of alternating semiconductor layers having different lattice constants, and thus the regrown source/drain stressors can be omitted in such embodiments.

In some embodiments, a method includes forming a fin structure having a stack of alternating first semiconductor layers and second semiconductor layers over a substrate; forming a dummy gate structure across the fin structure; etching portions of the fin structure that extend laterally beyond the dummy gate structure to expose portions of the substrate; forming source/drain stressors over the exposed portions of the substrate; after forming the source/drain stressors, removing the dummy gate structure; after removing the dummy gate structure, removing the first semiconductor layers such that the second semiconductor layers are suspended between the source/drain stressors; and forming a gate structure to surround each of the suspended second semiconductor layers. Forming the source/drain stressors comprises forming a first source/drain layer over the exposed portions of the substrate, and forming a second source/drain layer over the first source/drain layer. An atomic concentration of a Group IV element or a Group V element in the second source/drain layer is greater than that in the first source/drain layer.

In some embodiments, a semiconductor device includes a plurality of nanosheets, source/drain stressors, and a gate structure. The nanosheets extend in a first direction above the semiconductor substrate and are arranged in a second direction substantially perpendicular to the first direction. The source/drain stressors are on either side of the nanosheets. Each of the source/drain stressors includes a first epitaxial layer and a second epitaxial layer over the first epitaxial layer. The first and second epitaxial layers are made of an alloy semiconductor of a first Group IV element and a second Group IV element having a lattice constant greater than that of the first group IV element, and an atomic ratio of the second Group IV element to the first Group IV element in the second epitaxial layer is greater than that in the first epitaxial layer. The gate structure wraps around each of the nanosheets.

A method includes forming a fin structure having a stack of alternating first semiconductor layers and second semiconductor layers over a substrate, wherein a concentration of an impurity of a first conductivity type in the first semiconductor layers is greater than that in the second semiconductor layers, and the second semiconductor layers are made of a material having a lattice constant different than that of the first semiconductor layers; forming a dummy gate structure across the fin structure; forming gate spacers on opposite sidewalls of the dummy gate structure, respectively; removing the dummy gate structure to form a gate trench between the gate spacers; removing portions of the first semiconductor layers in the gate trench, such that channel regions of the second semiconductor layers are suspended above the substrate; forming a gate structure to surround each of the suspended channel regions; and after forming the gate structure, performing a first annealing process to diffuse the impurity of the first conductivity type from the first semiconductor layers into source/drain regions of the second semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
a plurality of nanosheets extending in a first direction above a semiconductor substrate and arranged in a second direction substantially perpendicular to the first direction;
source/drain stressors on either side of the nanosheets, each of the source/drain stressors comprises a first epitaxial layer and a second epitaxial layer over the first epitaxial layer, wherein the first and second epitaxial layers are made of a Group IV element and a Group V element, and an atomic ratio of the Group V element to the Group IV element in the second epitaxial layer is greater than an atomic ratio of the Group V element to the Group IV element in the first epitaxial layer; and
a gate structure wrapping around each of the nanosheets.

2. The device of claim 1, wherein the plurality of nanosheets comprise a first nanosheet and a second nanosheet above the first nanosheet, and the first nanosheet is in contact with the first epitaxial layer and spaced from the second epitaxial layer.

3. The device of claim 2, wherein the second nanosheet is in contact with the second epitaxial layer and spaced from the first epitaxial layer.

4. The device of claim 1, wherein the plurality of nanosheets comprise a first nanosheet and a second nanosheet above the first nanosheet, the first nanosheet has a first tensile strain induced by the first epitaxial layer, and the second nanosheet has a second tensile strain induced by the second epitaxial layer.

5. The device of claim 1, wherein the first and second epitaxial layers form an inverted V-shaped cross-section.

6. The device of claim 1, wherein the source/drain stressors are of n-type.

7. The device of claim 1, wherein the Group IV element is silicon, and the Group V element is phosphorous.

8. A device comprising:
a plurality of nanosheets extending in a first direction above a semiconductor substrate and arranged in a second direction substantially perpendicular to the first direction, wherein the plurality of nanosheets comprise a first nanosheet and a second nanosheet above the first nanosheet, and the second nanosheet has a strain greater than the first nanosheet;
source/drain stressors on either side of the nanosheets, each of the source/drain stressors comprising a first epitaxial layer in contact with the first nanosheet and a second epitaxial layer in contact with the second nanosheet, wherein the first and second epitaxial layers are made of an alloy semiconductor of a first Group IV element and a second Group IV element having a lattice constant greater than a lattice constant of the first Group IV element, and an atomic ratio of the second Group IV element to the first Group IV element in the second epitaxial layer is greater than an atomic ratio of the second Group IV element to the first Group IV element in the first epitaxial layer; and
a gate structure wrapping around each of the plurality of nanosheets.

9. The device of claim 8, wherein the first and second epitaxial layers form an interface above a top surface of the first nanosheet.

10. The device of claim 8, wherein the first and second epitaxial layers form an interface below a bottom surface of the second nanosheet.

11. The device of claim 8, wherein the second epitaxial layer has a germanium-to-silicon ratio greater than a germanium-to-silicon ratio of the first epitaxial layer.

12. The device of claim 11, wherein the first nanosheet has a germanium-to-silicon ratio less than the germanium-to-silicon ratio of the first epitaxial layer.

13. The device of claim 8, wherein the second epitaxial layer has a tin-to-germanium ratio greater than a tin-to-germanium ratio of the first epitaxial layer.

14. The device of claim 13, wherein the first nanosheet has a tin-to-germanium ratio less than the tin-to-germanium ratio of the first epitaxial layer.

15. The device of claim 8, wherein the second epitaxial layer has a phosphorous-to-silicon ratio greater than a phosphorous-to-silicon ratio of the first epitaxial layer.

16. The device of claim 8, wherein each of the source/drain stressors further comprises a third epitaxial layer over the second epitaxial layer.

17. A device comprising:
a plurality of first semiconductor layers over a substrate;
a plurality of second semiconductor layers alternately arranged with the plurality of first semiconductor layers; and
a gate structure extending through each of the plurality of first semiconductor layers, and surrounding channel regions of the plurality of second semiconductor layers, wherein the plurality of second semiconductor layers have source/drain regions extending from a respective one of the channel regions of the plurality of second semiconductor layers to past opposing sides of the gate structure, and the channel regions of the plurality of second semiconductor layers have a greater strain than the source/drain regions of the plurality of second semiconductor layers.

18. The device of claim 17, wherein the plurality of second semiconductor layers have a lattice constant greater than a lattice constant of the plurality of first semiconductor layers.

19. The device of claim 17, wherein the plurality of second semiconductor layers have a lattice constant less than a lattice constant of the plurality of first semiconductor layers.

20. The device of claim 17, further comprising:
a strain-relaxed buffer layer below the plurality of first semiconductor layers and the plurality of second semiconductor layers.

* * * * *